United States Patent
Yamaguchi et al.

(10) Patent No.: US 7,741,687 B2
(45) Date of Patent: Jun. 22, 2010

(54) MICROSTRUCTURE, SEMICONDUCTOR DEVICE, AND MANUFACTURING METHOD OF THE MICROSTRUCTURE

(75) Inventors: Mayumi Yamaguchi, Kanagawa (JP); Konami Izumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 518 days.

(21) Appl. No.: 11/681,627

(22) Filed: Mar. 2, 2007

(65) Prior Publication Data

US 2007/0218630 A1    Sep. 20, 2007

(30) Foreign Application Priority Data

Mar. 10, 2006    (JP)    ............... 2006-066786

(51) Int. Cl.
*H01L 29/00* (2006.01)
(52) U.S. Cl. ............... 257/419; 257/415; 257/E27.001; 438/52; 438/53
(58) Field of Classification Search .............. 438/52, 438/53, 964; 257/415, 419, E27.001
See application file for complete search history.

(56) References Cited

U.S. PATENT DOCUMENTS

| | | | |
|---|---|---|---|
| 6,531,331 | B1 | 3/2003 | Bennett et al. |
| 6,860,153 | B2 * | 3/2005 | Leung .................. 73/708 |
| 6,876,046 | B2 | 4/2005 | Prophet |
| 2003/0089690 | A1 | 5/2003 | Yamazaki et al. |
| 2003/0211714 | A1 | 11/2003 | Yamazaki et al. |
| 2004/0256979 | A1 | 12/2004 | Murakami et al. |
| 2005/0227428 | A1 | 10/2005 | Mihai et al. |
| 2006/0267153 | A1 | 11/2006 | Yamaguchi et al. |

FOREIGN PATENT DOCUMENTS

| | | |
|---|---|---|
| JP | 10-107339 | 4/1998 |
| JP | 11-340477 | 12/1999 |
| WO | 03/067662 A1 | 8/2003 |
| WO | 03/078299 A1 | 9/2003 |

OTHER PUBLICATIONS

Norio Fujitsuka et al.; "A New Processing Technique to Prevent Stiction Using Silicon Selective Etching for SOI-MEMS"; *R&D Review of Toyota CRDL*, vol. 36, No. 4; pp. 55-59; Dec. 2001.

D.J. McCulloch et al.; "Surface roughness effects in laser crystallized polycrystalline silicon", Appl. Phys. Lett. (Applied Physics Letters); Apr. 17, 1995; pp. 2060-2062; vol. 66, No. 16.

Jian Ming Jiang; "Monolithic integrated MEMS technology"; Journal of Transducer Technology; Mar. 1, 2005; pp. 1-3/6; vol. 24, No. 3 with English abstract.

Office Action (Chinese Patent Application No. 200710086232.3) dated Feb. 5, 2010 with full English translation.

* cited by examiner

*Primary Examiner*—Zandra Smith
*Assistant Examiner*—Christy L Novacek
(74) *Attorney, Agent, or Firm*—Fish & Richardson P.C.

(57) ABSTRACT

A microstructure includes a first structural layer and a second structural layer which faces the first structural layer with a space interposed therebetween and is partially fixed to the first structural layer. At least one of the first structural layer and the second structural layer can be displaced. Further, opposed surfaces of the first structural layer and the second structural layer are different in roughness.

10 Claims, 16 Drawing Sheets

FIG. 8A1
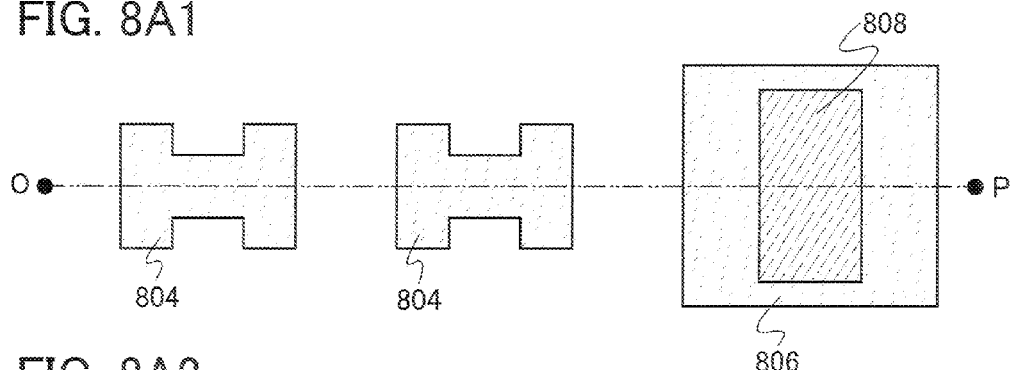
FIG. 8A2
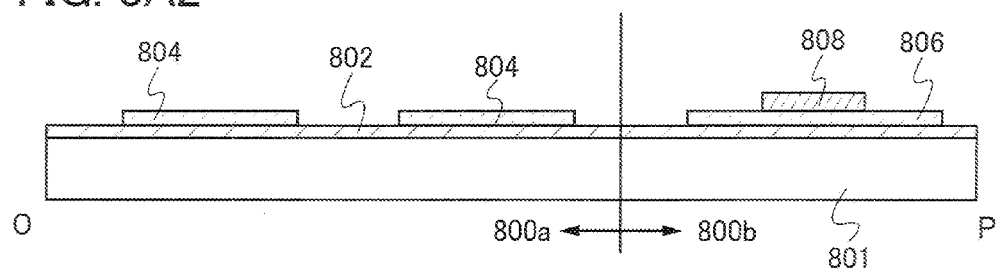
FIG. 8B1
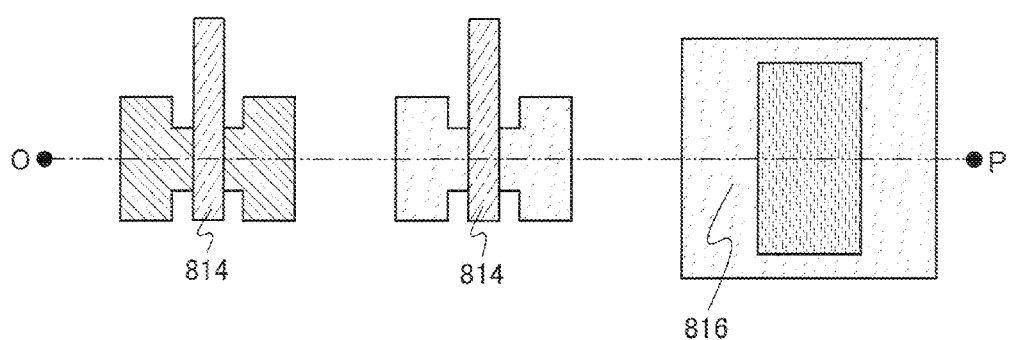
FIG. 8B2
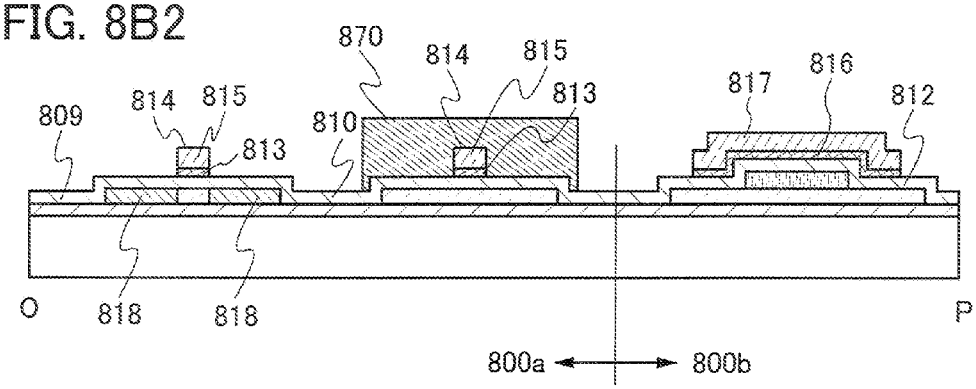

FIG. 9A1
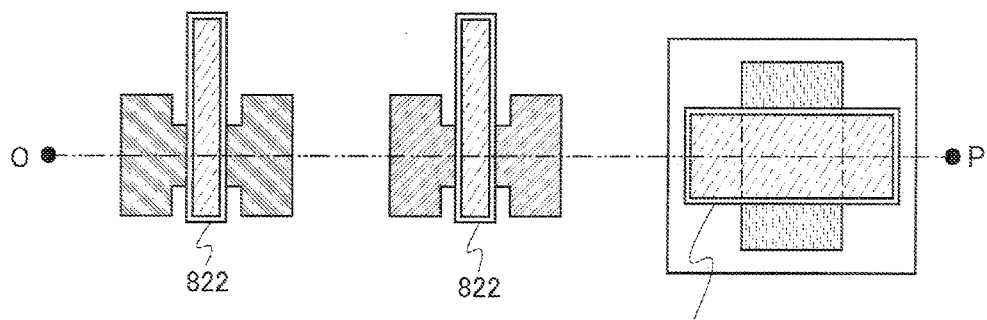
FIG. 9A2
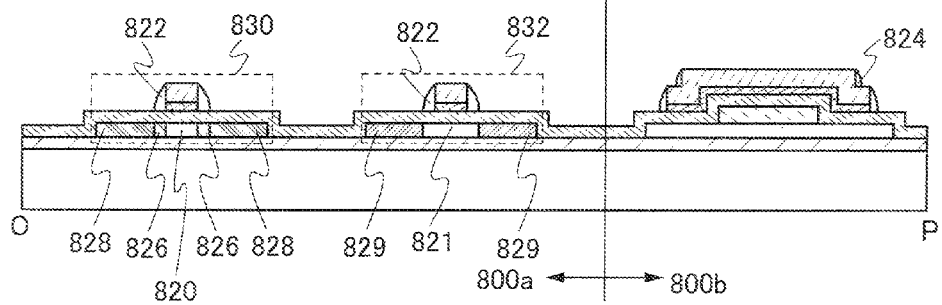
FIG. 9B1
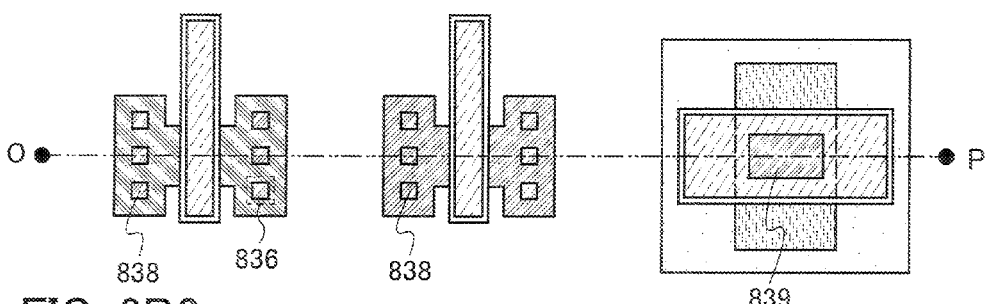
FIG. 9B2
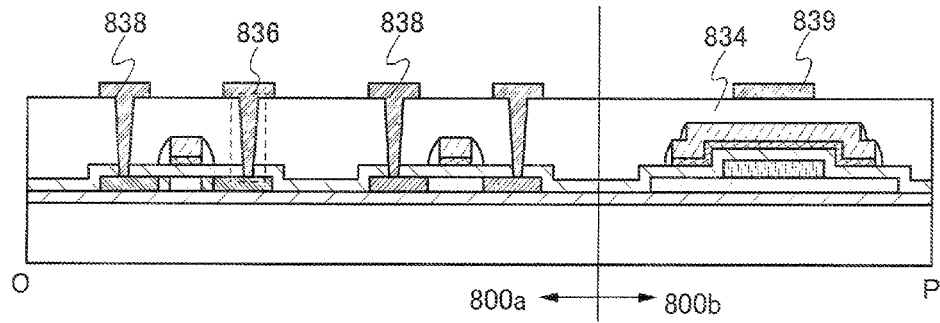

FIG. 10A1
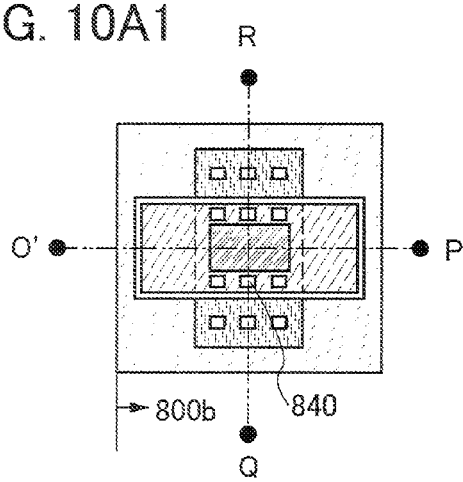
FIG. 10A2
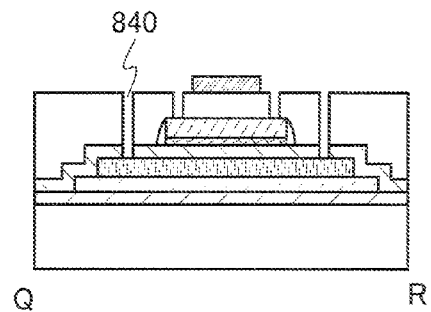
FIG. 10B1
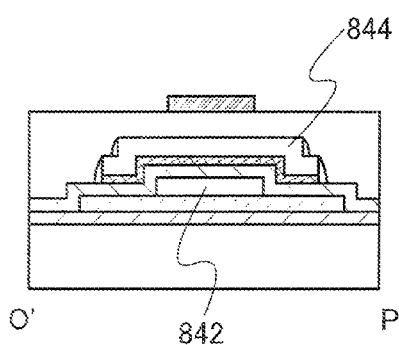
FIG. 10B2
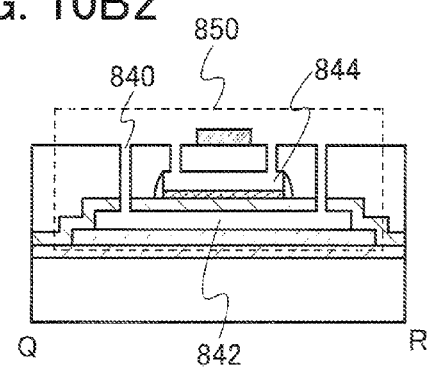
FIG. 10C
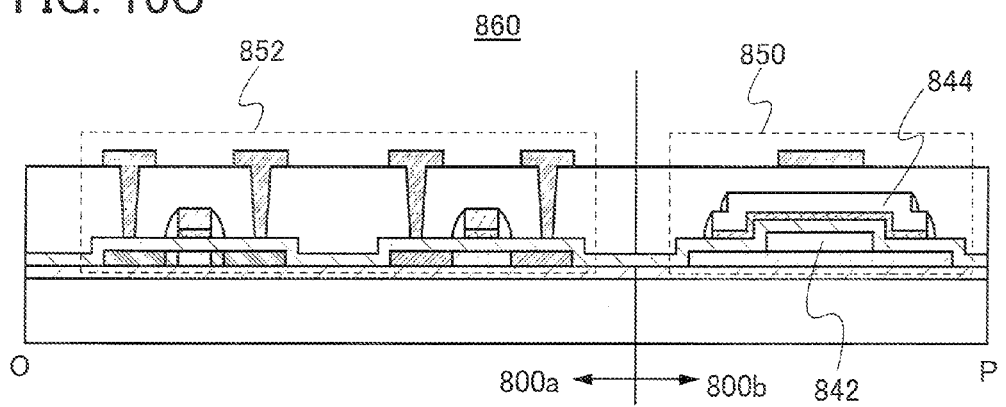

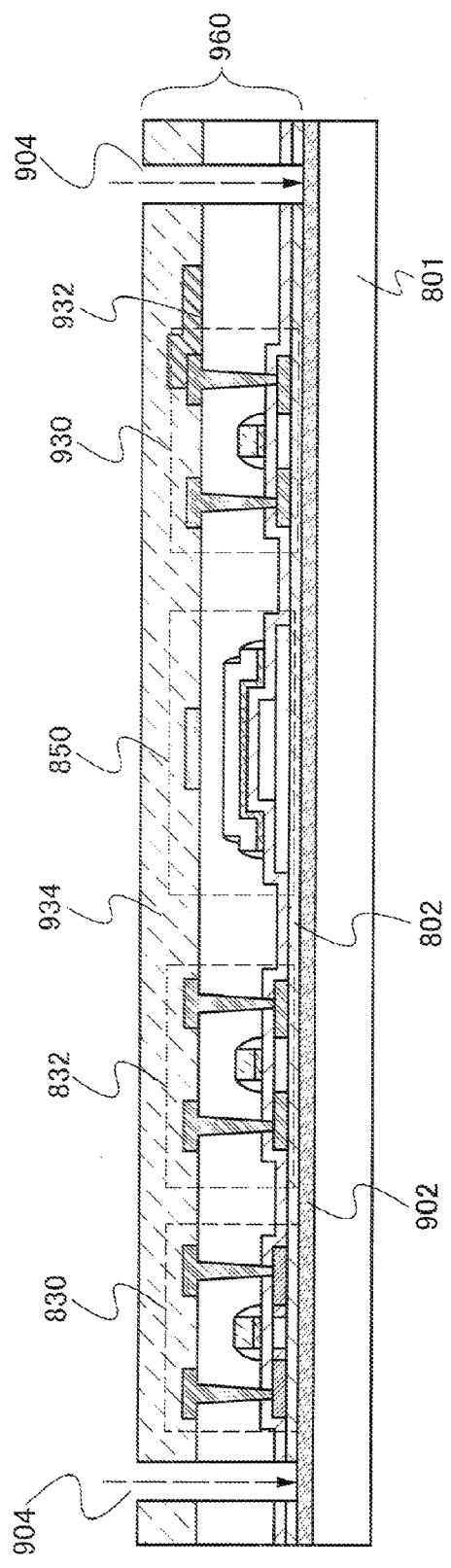 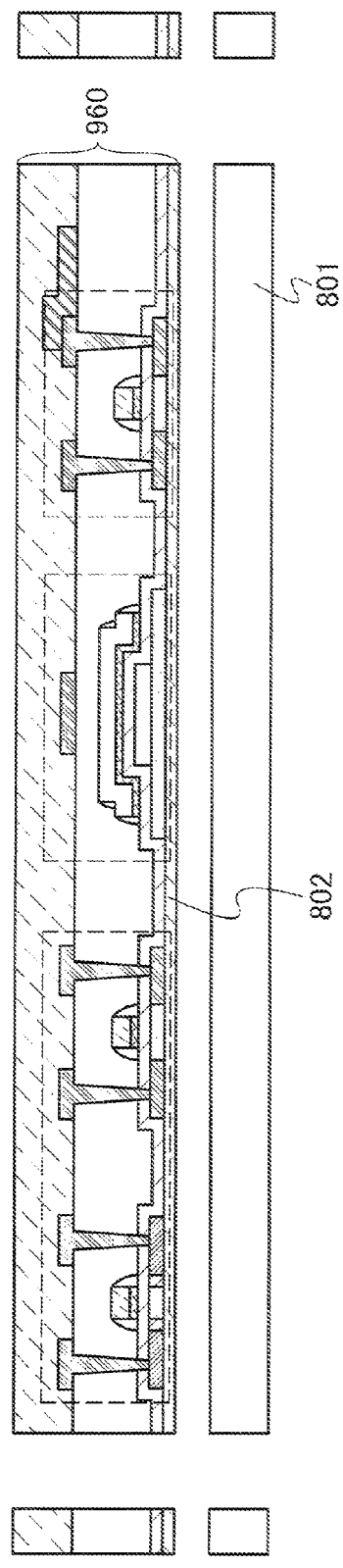
FIG. 13A
FIG. 13B

MICROSTRUCTURE, SEMICONDUCTOR DEVICE, AND MANUFACTURING METHOD OF THE MICROSTRUCTURE

BACKGROUND OF THE INVENTION

1. Field of the Invention

The present invention relates to a microstructure and a manufacturing method thereof.

2. Description of the Related Art

Research has been conducted on manufacturing micromachines by using a process for manufacturing a semiconductor element or a method similar to that process. For example, a three-dimensional structure having a space portion and a portion moving in the space portion, such as a gear or a bridge structure has been manufactured by processing a silicon wafer.

In recent years, research has been advanced on manufacturing a micro electromechanical device having one function by manufacturing a structure as described above and a semiconductor element over the same substrate or by attaching them manufactured separately, to each other. Such a micro electromechanical device is called a MEMS (Micro Electro Mechanical System), a micromachine, a micromachining, or the like.

Micro electromechanical devices (micromachines) are roughly classified into two groups according to their manufacturing methods. One is called a bulk micromachine which is obtained by manufacturing a three-dimensional structure in such a way that a silicon wafer or an SOI (Silicon On Insulator) substrate itself is processed by etching or polishing. The other is called a surface micromachine which is obtained by manufacturing a three-dimensional structure in such a way that a thin film is stacked over a substrate such as a silicon wafer and the thin film is processed by photolithography and etching.

In the case of the bulk micromachine where the substrate is processed from various directions, the degree of freedom in manufacturing a three-dimensional structure is so high that various structures can be manufactured. However, many steps thereof are different from those in a process for manufacturing a semiconductor element. Therefore, in many cases, a semiconductor element and a structure are separately manufactured and then attached to each other, or they are packaged into one without being attached to each other. In the case of the surface micromachine, a general process for manufacturing a semiconductor element is applied.

Here, a basic structure and a manufacturing method of a structure in a surface micromachine will be described. First, as shown in FIG. 12A, a sacrifice layer 1002 is formed to form a space portion of a structure. This sacrifice layer 1002 is removed later. Note that although the sacrifice layer 1002 is formed over a substrate, the substrate is not shown in the drawing.

Next, as shown in FIG. 12B, a structural layer 1004 is formed over the sacrifice layer 1002. The structural layer 1004 is formed over the sacrifice layer 1002 so that the structural layer 1004 has a three-dimensional shape.

Next, as shown in FIG. 12C, the sacrifice layer 1002 is etched away. A space portion 1006 is formed under the structural layer 1004 by removing the sacrifice layer 1002; thus, a part of the structural layer 1004, which is disposed above the space portion 1006, becomes movable. Note that the part of the structural layer 1004, which is disposed above the space portion 1006 is a part of the structural layer 1004, which is in contact with a top surface of the sacrifice layer 1002 in FIG. 12B.

Described here is an example of a simple structure in which the structural layer 1004 and the space portion 1006 are provided over a substrate. A base film or a bottom electrode may also be formed over the substrate. Further, each of the sacrifice layer and the structural layer may have a multi-layer structure.

As well as being an important step in manufacturing a micromachine, the sacrifice layer etching is a rate-controlling point with many problems. For example, there is a problem in that the structural layer 1004 buckles as shown in FIG. 12D after the sacrifice layer etching, to stick to the substrate.

Further, there is a problem in that the structural layer 1004 buckles during operation, to stick to the substrate because of static electricity or the like.

In order to solve the above problems, a method of etching a sacrifice layer, or materials or shapes of a structural layer and a layer which faces the structural layer have been considered (e.g., Patent Document 1: Japanese Published Patent Application No. Hei10-107339, and Patent Document 2: Japanese Published Patent Application No. Hei11-340477).

In Patent Document 1, a method in which a sticking phenomenon of a silicon microstructure is prevented by removing a sacrifice layer by steam phase etching is disclosed.

In Patent Document 2, an acceleration sensor in which many protrusions and recesses where a width of each recess is 0.01 μm or more and 0.1 μm or less are formed randomly in at least one surface of opposed surfaces of a fixed electrode and a movable electrode is disclosed. In addition, a method in which the protrusions and recesses in the opposed surface are formed by an anode chemical conversion treatment in or after sacrifice layer etching is disclosed.

SUMMARY OF THE PRESENT INVENTION

However, the etching method is limited to steam phase etching in Patent Document 1. In addition, in Patent Document 2, since the protrusions and recesses are formed in a silicon surface by using the anode chemical conversion method during or after sacrifice layer etching, a material is limited to one applicable to the anode chemical conversion method.

In view of the above-described problems, it is an object of the present invention to provide a microstructure and a manufacturing method thereof in which a defect during a manufacturing process or during operation of the microstructure is reduced. Specifically, it is an object of the present invention to provide a structure and a manufacturing method of a microstructure which can prevent buckling in etching a sacrifice layer away.

Further, it is an object of the present invention to provide a structure and a manufacturing method of a microstructure which can prevent buckling during operation of the microstructure. Further, it is an object of the present invention to provide a structure of a microstructure with the improved durability.

According to one feature of a microstructure of the present invention, a first structural layer and a second structural layer which are disposed with a space portion so that at least one of them can be displaced are included, and opposed surfaces of the first structural layer and the second structural layer are different in roughness.

According to one feature of a specific structure of the microstructure of the present invention, a first structural layer and a second structural layer which faces the first structural layer with a space portion interposed therebetween and is partially fixed to the first structural layer are included, at least one of the first structural layer and the second structural layer can be displaced, and opposed surfaces of the first structural layer and the second structural layer are different in roughness.

Further, according to one feature of the microstructure of the present invention, one of the first structural layer and the second structural layer is a crystalline silicon film.

Further, the present invention also includes a semiconductor device including a microstructure and a semiconductor element provided over the same substrate. According to one feature of a specific structure thereof, the microstructure includes a first structural layer and a second structural layer which faces the first structural layer with a space portion interposed therebetween and is partially fixed to the first structural layer, and the semiconductor element includes a semiconductor layer and a gate electrode layer which is provided over the semiconductor layer with a gate insulating layer interposed therebwteen. The first structural layer is formed of a semiconductor layer which is the same as the aforementioned semiconductor layer whereas a part of the second structural layer is formed of an insulating layer which is the same as the gate insulating layer. At least one of the first structural layer and the second structural layer of the microstructure can be displaced, and opposed surfaces of the first structural layer and the second structural layer are different in roughness.

Further, in the semiconductor device of the present invention, each of the first structural layer of the microstructure and the semiconductor layer of the semiconductor element is preferably a crystalline silicon film.

According to one feature of a manufacturing method of a microstructure of the present invention, a first structural layer is formed over a substrate, surface roughening is performed to the first structural layer, a sacrifice layer is formed over the first structural layer, surface roughening is performed to the sacrifice layer, a second structural layer is formed over the first structural layer and the sacrifice layer, and the sacrifice layer is removed to form a space.

According to one feature of another manufacturing method of the microstructure of the present invention, a first structural layer is formed over a substrate, surface roughening is performed to the first structural layer by irradiation with a laser beam, a sacrifice layer is formed over the first structural layer, surface roughening is performed to the sacrifice layer by irradiation with a laser beam, a second structural layer is formed over the first structural layer and the sacrifice layer, and the sacrifice layer is removed to form a space.

According to one feature of another manufacturing method of the microstructure of the present invention, a first structural layer is formed over a substrate, surface roughening is performed to the first structural layer by irradiation with a laser beam, a sacrifice layer is formed over the first structural layer, surface roughening is performed to the sacrifice layer by heat treatment, a second structural layer is formed over the first structural layer and the sacrifice layer, and the sacrifice layer is removed to form a space.

Further, according to one feature of the manufacturing method of the microstructure of the present invention, the sacrifice layer is formed using tungsten, molybdenum, or titanium.

Further, according to one feature of another manufacturing method of the microstructure of the present invention, the sacrifice layer is formed using aluminum.

By the present invention, a defect during a manufacturing process of a microstructure can be prevented. Further, a defect can be prevented from occurring during operation of a microstructure. Accordingly, yield or reliability can be improved.

Further, by the present invention, a movable portion of a microstructure can be made strong. Therefore, durability of a microstructure can be improved. Note that in this specification, a movable portion means a part of a structural layer, the part being able to be displaced (the part being displaceable).

BRIEF DESCRIPTION OF DRAWINGS

FIGS. 8A1 to 8B2 are diagrams showing one example of a manufacturing method of a semiconductor device of the present invention.

FIGS. 9A1 to 9B2 are diagrams showing one example of a manufacturing method of a semiconductor device of the present invention.

FIGS. 10A1 to 10C are diagrams showing one example of a manufacturing method of a semiconductor device of the present invention.

FIGS. 13A and 13B are diagrams showing one example of a manufacturing method of a semiconductor device of the present invention.

DETAILED DESCRIPTION OF THE INVENTION

Figure 1A:
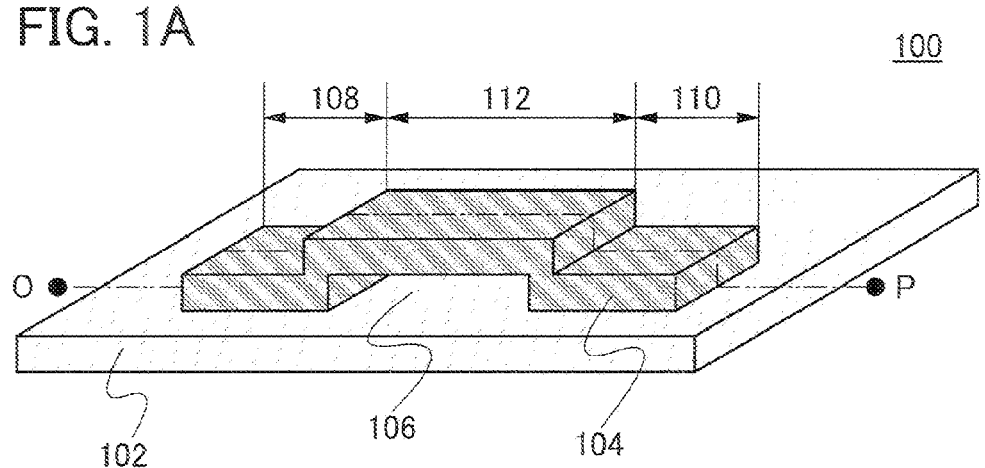
FIGS. 1A to 1C are exemplary diagrams showing one example of a microstructure of the present invention.

Although the present invention will be fully described by way of embodiment modes and an embodiment with reference to the accompanying drawings, it is to be understood that various changes and modifications will be apparent to those skilled in the art. Therefore, unless such changes and modifications depart from the scope of the present invention, they should be construed as being included therein. Note that in each structure of the present invention hereinafter described, the same ones are denoted by the same reference numerals in the drawings.

Embodiment Mode 1

Figure 1B:
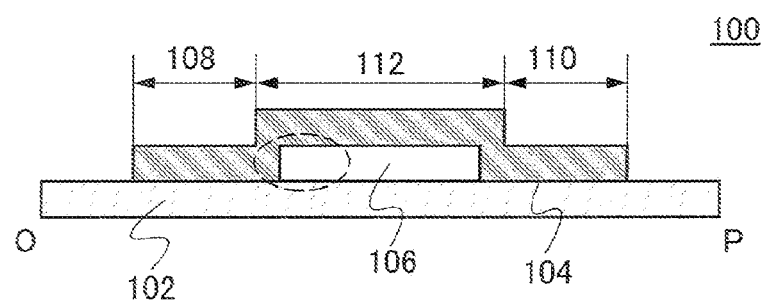
Figure 1C:
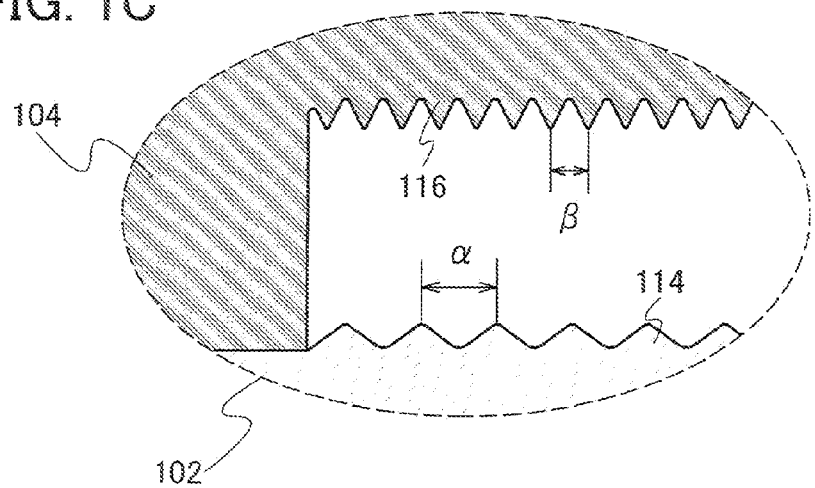

This embodiment mode will describe one example of a microstructure of the present invention with reference to FIGS. 1A to 1C. A microstructure described in this embodiment mode is a microstructure with a so-called post-and-beam structure.

FIGS. 1A and 1B are a perspective view and a cross-sectional view of a microstructure of the present invention. FIG. 1B corresponds to a cross-sectional view taken along a broken line O-P in FIG. 1A.

A microstructure 100 of the present invention includes a first structural layer 102 and a second structural layer 104. Further, a space portion 106 is provided between the first structural layer 102 and the second structural layer 104.

The second structural layer 104 includes supporting portions 108 and 110 and a movable portion 112, and has a three-dimensional bridge structure on the first structural layer 102. Specifically, the second structural layer 104 includes the supporting portions 108 and 110 which contact with the first structural layer 102 and the movable portion 112 which does not contact with the first structural layer 102. In other words, both ends of the movable portion 112 are fixed to the first structural layer 102 by the supporting portions 108 and 110. Note that the movable portion 112 is a part which can be displaced in the second structural layer 104.

The space portion 106 is disposed between the first structural layer 102 and the movable portion 112 of the second structural layer 104. The movable portion 112 of the second structural layer 104 becomes movable to be displaced due to the existence of the space portion 106.

Next, FIG. 1C is a magnified view of a portion surrounded by a dotted line in FIG. 1B.

As shown in FIG. 1C, the first structural layer 102 and the second structural layer 104 have rough surfaces which face each other. Further, the first structural layer 102 and the second structural layer 104 have the rough surfaces with different degrees of roughness. That is, when a surface of the first structural layer 102, which faces the second structural layer 104 is referred to as a first surface 114 and a surface of the second structural layer 104, which faces the first structural layer 102 is referred to as a second surface 116, the first surface 114 and the second surface 116 are different in roughness.

Specifically, each of the first surface 114 and the second surface 116 are made to be a rough surface by providing a plurality of protrusions. In other words, each of the first surface 114 and the second surface 116 are made to be a rough surface by providing a plurality of recesses.

Here, the protrusion provided in the first surface 114 is referred to as a protrusion A and the distance between vertexes of the adjacent protrusions A is referred to as $\alpha$. Similarly, the protrusion provided in the second surface 116 is referred to as a protrusion B and the distance between vertexes of the adjacent protrusions B is referred to as $\beta$. In the present invention, $\alpha$ is preferably larger than $\beta$. Further, $\alpha$ is preferably 1.5 to 10 times inclusive as large as $\beta$. At this time, $\alpha$ is preferably in the range of 0.2 to 1 μm inclusive. Further, $\beta$ is preferably in the range of 0.02 to 0.1 μm inclusive.

Note that as mentioned above, it can also be said that the first surface 114 and the second surface 116 are each made to be a rough surface by providing a plurality of recesses. Therefore, when the recess provided in the first surface is referred to as a recess A, the distance between grooves of the adjacent recesses A is $\alpha$. Similarly, when the recess provided in the second surface is referred to as a recess B, the distance between grooves of the adjacent recesses B is $\beta$.

Note that in the first surface 114 and the second surface 116, the protrusions are not necessarily provided regularly as long as the degrees of whole roughness in the first surface 114 and the second surface 116 are different from each other. That is, in each of the first surface 114 and the second surface 116, all the distances between the vertexes are not necessarily the same. That is, in accordance with the present invention, the averaged distance $\alpha$ between vertexes of the adjacent protrusions A in the whole first surface 114 is larger than the averaged distance $\beta$ between vertexes of the adjacent protrusions B in the whole second surface 116.

Note that the microstructure described above has a post-and-beam structure (also called a beam) in which the space portion 106 is provided between the first structural layer 102 and the second structural layer 104 and both end portions of the second structural layer 104 are fixed to the first structural layer 102. However, the present invention is not limited to the above structure and may also have a cantilever structure (also called a cantilever) in which only one end portion of the second structural layer is fixed to the first structural layer. Further alternatively, the second structural layer may have a comb shape, a gear shape, or the like as long as the second structural layer has a part which can be displaced.

In the present invention, the first structural layer and the second structural layer have rough surfaces which face each other. Further, the first structural layer and the second structural layer have the rough surfaces with different degrees of roughness. By employing the microstructure of the present invention, a contact portion of the second structural layer with the first structural layer in moving the second structural layer can be made small. Therefore, so-called buckling (also called sticking), such a phenomenon that the first structural layer and the second structural layer stick to each other by a shock, static electricity, or the like at the time of operation of the microstructure can be prevented.

Further, in the microstructure of the present invention, the protrusions are provided for the movable portion. Consequently, an internal stress in the movable portion can be dispersed so that the movable portion can be moved more easily. In addition, durability of the movable portion can be improved.

Embodiment Mode 2

One example of a manufacturing method of a microstructure of the present invention will be described with reference to FIGS. 2A to 2D and 3A and 3D.

Figure 2A:
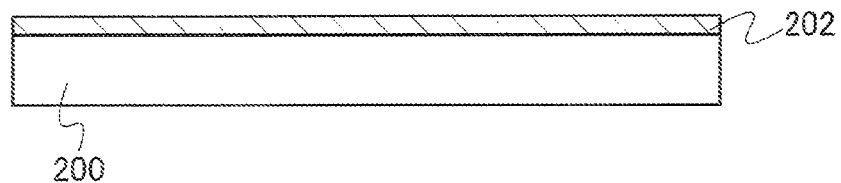
FIGS. 2A to 2D are diagrams showing one example of a manufacturing method of a microstructure of the present invention.

First, a substrate having an insulating surface 200 is prepared. Next, a base insulating film 202 is formed over the substrate 200 (FIG. 2A). As the substrate having an insulating surface 200, a glass substrate, a quartz substrate, a plastic substrate, or the like can be used. By forming a microstructure over a plastic substrate, a device which is thin, lightweight, and highly flexible can be obtained. Further, by thinning a glass substrate by polishing or the like, a thin device can be obtained as well. As a further alternative, a substrate in which an insulating film is formed on a conductive substrate of metal or the like or a semiconductor substrate of silicon or the like may also be used.

For the base insulating film 202, a material such as silicon oxide, silicon nitride, silicon nitride containing oxygen, silicon oxide containing a slight amount of nitrogen, or the like can be used. A single layer or a plurality of layers is formed of a film using such a material, by plasma CVD, low pressure CVD, sputtering, PVD, or the like. Note that, the base insulating film is not particularly required to be formed unless unevenness on the substrate or an impurity diffusion from the substrate becomes a problem.

Next, a first structural layer 206 is formed over the base insulating film 202. Detailed description on formation of the first structural layer 206 will be made below.

First, an amorphous semiconductor film 204 is formed over the base insulating film 202. For the amorphous semiconductor film 204, a material such as silicon, silicon-germanium (SiGe), or the like can be used. A film using such a material is formed by plasma CVD, low pressure CVD, sputtering, PVD, or the like. Further, the amorphous semiconductor film 204 may be formed continuously after forming the base insulating film 202 with the same film-forming apparatus as that of the base insulating film 202.

Figure 2B:
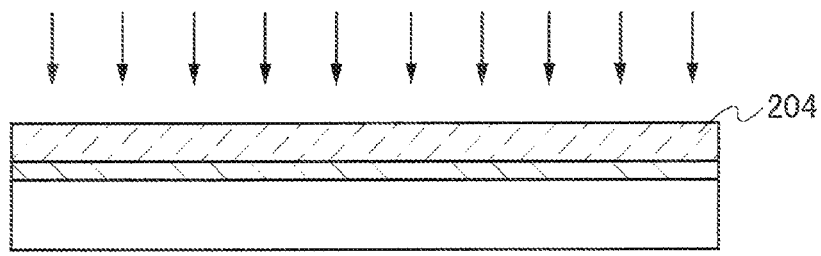

Next, the amorphous semiconductor film 204 is irradiated with a laser beam to be crystallized (FIG. 2B). As a laser of crystallizing the amorphous semiconductor film 204, a laser which emits a continuous wave laser beam (hereinafter referred to as a CW laser beam) or a pulsed wave laser beam (hereinafter referred to as a pulsed laser beam) can be used. As a specific laser beam, a laser beam emitted from one or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. By irradiating the amorphous semiconductor layer with a fundamental wave or any of second to fourth harmonics of such a laser beam, a silicon layer having crystals with a large grain size can be obtained. For example, a second harmonic (532 nm) or a third harmonic (355 nm) of an Nd:$YVO_4$ laser (fundamental wave: 1064 nm) can be used. The laser irradiation requires a power density of approximately 0.01 to 100 $MW/cm^2$ (preferably 0.1 to 10 $MW/cm^2$). The laser is emitted at a scanning rate of approximately 10 to 2000 cm/sec.

Note that a fundamental wave of a CW laser and a harmonic of a CW laser may be used for the irradiation, or a fundamental wave of a CW laser and a harmonic of a pulsed laser may be used for the irradiation. By irradiating with a plurality of laser beams, energy can be compensated.

It is also possible to use a pulsed laser beam with a repetition rate such that a semiconductor film melted by a laser beam can be irradiated with the next pulsed laser beam before being solidified. By using a laser beam with such a repetition rate, crystal grains that are grown continuously in the scan direction can be obtained. Such a repetition rate of a pulsed laser beam is specifically 10 MHz or higher, which is much higher than the generally used frequency band of the several tens to several hundreds of Hz.

Note that the amorphous semiconductor film 204 may contain hydrogen depending on a film-forming method. In this case, in order not to spew the hydrogen by the irradiation of the laser beam, heat treatment is preferably performed so that the hydrogen of the semiconductor film is exhausted.

Figure 2C:
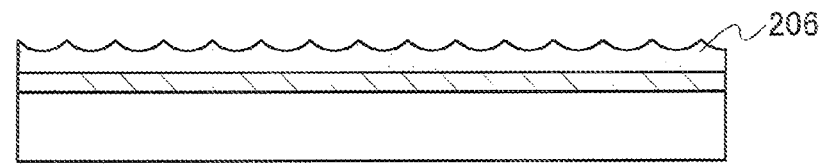
Figure 2D:
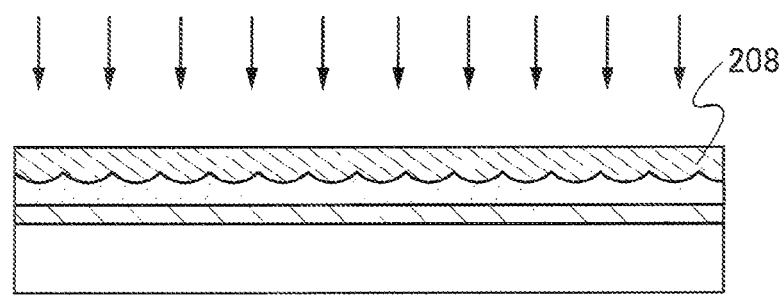

Through the above steps, a crystalline semiconductor film which is the first structural layer 206 is formed (FIG. 2C). In this time, surface roughening is performed to a surface of the first structural layer 206 (the crystalline semiconductor film) by the laser beam irradiation so that the surface becomes rough, thereby unevenness called a ridge is formed in the surface of the first structural layer 206. That is, the crystallization step of the amorphous semiconductor film by laser irradiation corresponds to the surface roughening by which the surface of the first structural layer becomes rough. Note that a ridge is an irregular projection in a film, which is formed at a portion where crystal grains hit each other. In the case where a protrusion formed here is referred to as a protrusion A, protrusions A are formed so that a distance between vertexes of the adjacent protrusions A is in the range of 0.2 µm to 1 µm inclusive. Note also that the ridges formed here are not necessarily regular. In the plurality of protrusions A formed in the surface of the first structural layer 206, the averaged distance between the vertexes of the adjacent protrusions A may be in the range of 0.2 µm to 1 µm inclusive. Further, regular ridges can also be formed depending on a laser irradiation condition.

Next, a sacrifice layer 210 is formed over the first structural layer 206. Note that the sacrifice layer means a layer which is to be selectively removed at a later step. Detailed description will be made on manufacture of the sacrifice layer 210 below.

First, a metal film 208 is formed of a material such as a metal material of tungsten (W), molybdenum (Mo), titanium (Ti), or the like or an alloy containing the metal material as a main component, or a plurality thereof, over the first structural layer 206. The metal film 208 is formed of a single layer or a plurality of layers by sputtering.

Figure 3A:
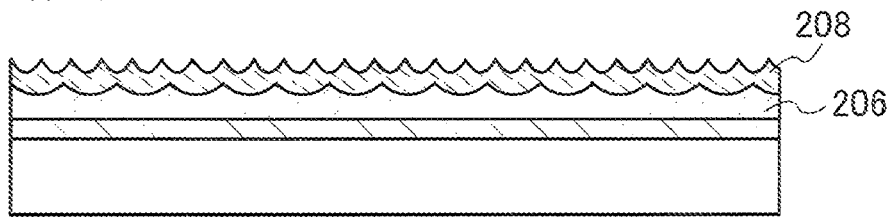
FIGS. 3A to 3D are diagrams showing one example of a manufacturing method of a microstructure of the present invention.

Next, laser irradiation is performed to the metal film 208 (FIG. 2D) so that surface roughening is performed to the metal film 208. By this surface roughening, a surface of the metal film 208 is made to be rough, so that unevenness is formed in the surface of the metal film 208 (FIG. 3A). For forming the unevenness in the metal film 208, a CW laser beam or a pulsed laser beam can be used. As a laser beam, a laser beam emitted from one or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used.

Note that a fundamental wave of a CW laser and a harmonic of a CW laser may be used for the irradiation, or a fundamental wave of a CW laser and a harmonic of a pulsed laser may be used for the irradiation. By irradiating with a plurality of laser beams, energy can be compensated.

It is also possible to use a pulsed laser beam with a repetition rate such that the metal film 208 melted by a laser beam can be irradiated with the next pulsed laser beam before being solidified. Such a repetition rate of a pulsed laser beam is specifically 10 MHz or higher, which is much higher than the generally used frequency band of the several tens to several hundreds of Hz. Note that the kind of the laser is selected as appropriate depending on the material of the metal film 208 to be irradiated. Therefore, the laser irradiation condition is required to be considered as appropriate depending on the metal film 208 to be irradiated.

Note that instead of laser irradiation, by performing heat treatment by an RTA (Rapid Thermal Annealing) method, the surface roughening of the metal film 208 can be performed. In the RTA method, a lamp such as a halogen lamp, a metal halide lamp, a xenon lamp, a carbon lamp, a high pressure sodium lamp, a high pressure mercury lamp, or the like can be used. By using such a lamp, the temperature is rapidly increased so that heat can be applied instantaneously for several microseconds to several minutes.

As described above, by irradiating the metal film 208 with a laser beam or light emitted from a lamp, surface roughening can be performed to the surface of the metal film 208. By such surface roughening, a plurality of unevenness is formed in the rough surface of the metal film 208. In the case where a protrusion formed here is referred to as a protrusion B, protrusions B are formed such that a distance between vertexes of the adjacent protrusions B is in the range of 0.02 µm to 0.1 µm inclusive are formed. Note that the distance between vertexes of the adjacent protrusions B is not necessarily regular as long as the averaged distance between the vertexes of the adjacent protrusions B is in the range of 0.02 µm to 0.1 µm inclusive.

Figure 3B:
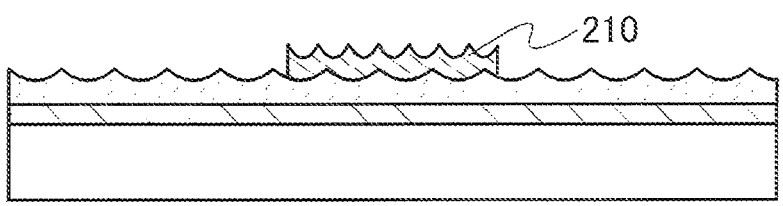
Figure 3C:
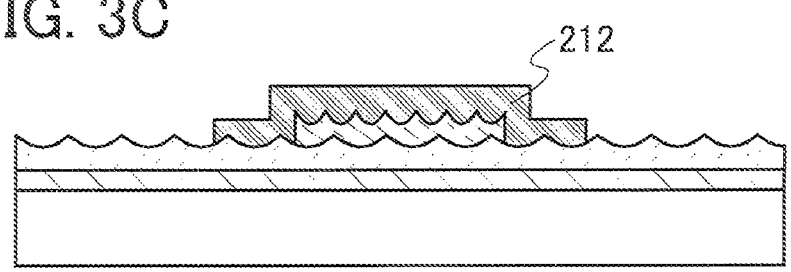
Figure 3D:
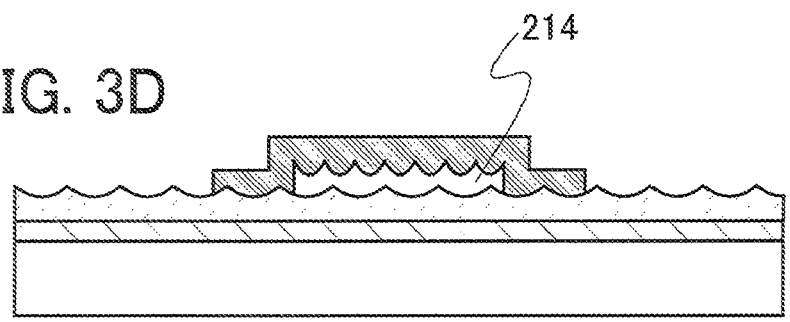

Next, the metal film 208 is processed into a desired shape by photolithography and etching to form the sacrifice layer 210. Through the above steps, the sacrifice layer 210 in which unevenness is formed in a surface is formed (FIG. 3B). Note that an example in which the sacrifice layer is formed in a desired shape by processing the metal film 208 is described in this embodiment mode; and similarly, the first structural layer may also be processed into a desired shape by photolithography and etching. The first structural layer may at least exist under the sacrifice layer.

In addition, although the sacrifice layer 210 is formed after the surface of the metal film 208 is made to be rough by surface roughening in this embodiment mode, the present invention is not limited to this as long as a surface of the sacrifice layer 210, obtained finally is rough. For example, the metal film 208 may be processed by photolithography and etching first, and then the processed film may be irradiated with a laser beam or light emitted from a lamp to form the sacrifice layer 210 in which the surface is uneven.

Next, a second structural layer 212 is formed over the first structural layer 206 and the sacrifice layer 210. The second structural layer 212 is formed of a material having etching selectivity to the sacrifice layer 210 with an etchant for etching the sacrifice layer later. For example, an insulating film formed using a material such as silicon oxide, silicon nitride, silicon nitride containing oxygen, or silicon oxide containing a slight amount of nitrogen can be used. Further, a metal having etching selectivity to the sacrifice layer 210 of tungsten, molybdenum, or the like, such as tantalum (Ta) or aluminum (Al) can be used. A layer formed using such a material having etching selectivity to the sacrifice layer 210 is processed into a desired shape by photolithography and etching to form the second structural layer 212. In this time, a surface where the second structural layer 212 is in contact with the sacrifice layer 210 is along the rough surface of the sacrifice layer 210. That is, in the surface where the second structural layer 212 is in contact with the sacrifice layer 210, a plurality of protrusions is formed along the protrusions B formed in the sacrifice layer 210, thereby the surface of the second structural layer 212 becomes rough.

Next, the sacrifice layer 210 is etched away. The etching is performed by a method by which etching selectivity among the first structural layer 206, the sacrifice layer 210, and the second structural layer 212 can be obtained. For example, in the case where tungsten or molybdenum is used for forming the sacrifice layer, the sacrifice layer can be removed by wet etching using liquid in which ammonia, hydrogen peroxide solution, and pure water are mixed. For example, a liquid in which 28 wt % of ammonia solution, 31 wt % of hydrogen peroxide solution, and pure water are mixed at a ratio of 3:5:2 (referred to as an ammonia peroxide mixture in this specification) can be used. Note that the present invention is not limited to this, and the etching method and etchant can be selected as appropriate.

By removing the sacrifice layer 210 as above, a space portion 214 is generated in a place of the sacrifice layer 210. Consequently, a microstructure having a space portion can be obtained.

Note that the microstructure described above has a post-and-beam structure (also called a beam) in which the space portion 214 is provided between the first structural layer 206 and the second structural layer 212 and both end portions of the second structural layer 212 are fixed to the first structural layer 206. However, the present invention is not limited to this and may also have a cantilever structure (also called a cantilever) in which only one end portion of the second structural layer is fixed to the first structural layer. Further alternatively, the second structural layer may have a comb shape, a gear shape, or the like as long as the second structural layer has a three-dimensional structure.

In the present invention, the first structural layer and the second structural layer have rough surfaces which face each other. Further, the first structural layer and the second structural layer have the rough surfaces with different degrees of roughness. Therefore, buckling of the structural layer which is to be a moving portion by a capillary phenomenon when the sacrifice layer is removed by wet etching can be prevented.

Further, in the present invention, a plurality of protrusions is provided in surfaces which face each other of the first structural layer and the second structural layer. In this embodiment mode, a part of the second structural layer functions as a movable portion which can be displaced. Consequently, since the protrusions are provided, an internal stress can be dispersed so that the movable portion can be moved more easily. In addition, durability of the movable portion can be improved.

Note that this embodiment mode can be combined with Embodiment Mode 1.

Embodiment Mode 3

This embodiment mode will describe the case where aluminum is used for the sacrifice layer with reference to FIGS. 4A to 4E. Note that the material, manufacturing method, or the like other than of the sacrifice layer are similar to those in Embodiment Mode 2. However, in this embodiment mode, a cantilever structure (a cantilever) in which only one end portion of a structural layer having a movable portion (a structural layer formed over a sacrifice layer) is fixed is employed.

Figure 4A:
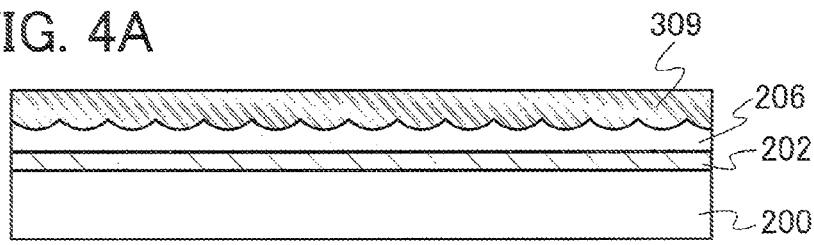
FIGS. 4A to 4E are diagrams showing one example of a manufacturing method of a microstructure of the present invention.

First, Embodiment Mode 2 is applied to manufacture up to the first structural layer 206. Next, an aluminum film 309 is formed over the first structural layer 206 by sputtering (FIG. 4A). Note that a multi-layer structure of another metal and an aluminum film may also be formed. In the case of the multi-layer structure, the aluminum film is required to be an upper layer.

Figure 4B:
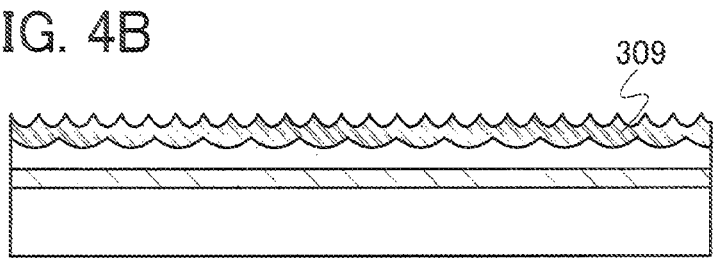

Next, surface roughening is performed to a surface of the aluminum film 309. By this surface roughening, unevenness is formed in the surface of the aluminum film 309, thereby making the surface of the aluminum film 309 rough (FIG. 4B). As a method of the surface roughening, a minute projection called a hillock may be generated in the aluminum film 309 by heat treatment at 250° C. or higher to form a protrusion. Further, the surface can also be made to be rough by supplying a current to the aluminum film 309 to generate heat partially by which the surface of the aluminum film 309 is partially heated so that a protrusion is selectively formed in the surface of the aluminum film 309.

Figure 4C:
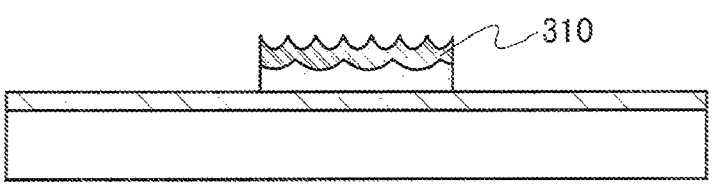
Figure 4D:
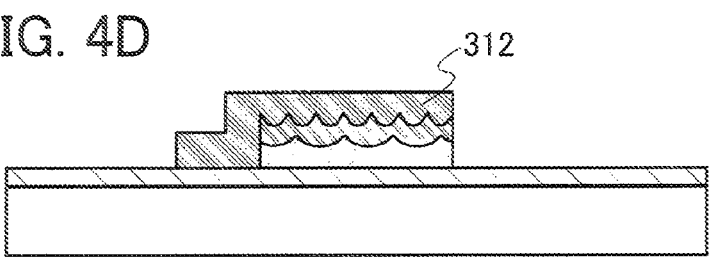
Figure 4E:
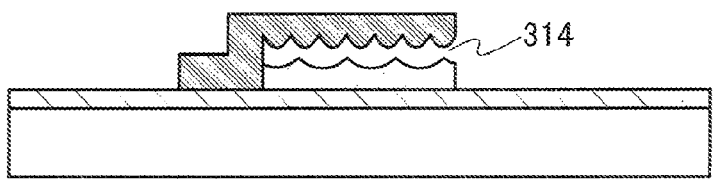

Next, the aluminum film 309 is processed into a desired shape by photolithography and etching to form a sacrifice layer 310. Note that in this embodiment mode, an example in which the first structural layer 206 under the aluminum film 309 which is to be the sacrifice layer 310 is also processed into a desired shape by the photolithography and etching is described. Of course, as described in Embodiment Mode 2, the first structural layer 206 is not necessarily processed. In addition, the order of a step of making a surface rough by forming unevenness in the aluminum film 309 and a step of processing the aluminum film 309 is not limited. Therefore, the aluminum film may be processed into a desired shape in advance to form a sacrifice layer, and unevenness may be formed in a surface of the sacrifice layer to make the surface of the sacrifice layer rough. Through the above steps, the rough sacrifice layer 310 in which unevenness is formed in the surface can be formed (FIG. 4C).

Next, a second structural layer 312 is formed over the sacrifice layer 310. The second structural layer 312 is formed of a material having etching selectivity to the sacrifice layer 310 with an etchant for etching the sacrifice layer later. For example, an insulating film formed using a material such as silicon oxide, silicon nitride, silicon nitride containing oxygen, or silicon oxide containing a slight amount of nitrogen can be used. Further, a metal having etching selectivity to the sacrifice layer 310 of aluminum can also be used. A layer formed using such a material having etching selectivity to the sacrifice layer 310 is processed into a desired shape by photolithography and etching to form the second structural layer 312. In this time, a surface where the second structural layer 312 is in contact with the sacrifice layer 310 is along the rough surface of the sacrifice layer 310. That is, in the surface where the second structural layer 312 is in contact with the sacrifice layer 310, a plurality of protrusions is formed along the protrusions formed in the sacrifice layer 310, thereby making the surface of the second structural layer 312 rough.

Note that in the case where an insulating film formed of a material such as silicon oxide, silicon nitride, silicon nitride containing oxygen, or silicon oxide containing a slight amount of nitrogen is formed as the second structural layer 312 by CVD, surface roughening by which a surface of the aluminum film 309 (the sacrifice layer 310) is made to be uneven can be omitted. This is because hillocks are generated in the under aluminum film 309 (the sacrifice layer 310) by a temperature in forming the insulating film by CVD so that the surface of the aluminum film 309 is made to be rough.

Next, the sacrifice layer 310 is etched away. The etching is performed by a method by which etching selectivity among the first structural layer 206, the sacrifice layer 310, and the second structural layer 312 can be obtained. For example, since the aluminum film is used as the sacrifice layer 310 in this embodiment mode, the sacrifice layer 310 can be removed by wet etching using liquid in which phosphoric acid, acetic acid, nitric acid, and pure water are mixed. For example, an acid in which phosphoric acid, acetic acid, nitric acid, and pure water are mixed at a ratio of 85:5:5:5 by vol % (an acid in which respective liquids are mixed at the above ratio is referred to as an aluminum mixed acid in this specification) can be used. Note that the present invention is not limited to this, and the etching method and etchant can be selected as appropriate.

By removing the sacrifice layer 310 as above, a space portion 314 is generated in the place of the sacrifice layer 310. Consequently, a microstructure having a space portion can be obtained.

Note that the microstructure described above has a cantilever structure (also called a cantilever) in which the space portion 314 is provided between the first structural layer 206 and the second structural layer 312 and one end portion of the second structural layer 312 is fixed to the first structural layer 206. The present invention is, however, not limited to this and may also have a post-and-beam structure (also called a beam) in which both end portions of the second structural layer are fixed to the first structural layer. Further alternatively, the second structural layer may have a comb shape, a gear shape, or the like.

In accordance with the present invention, the first structural layer and the second structural layer have rough surfaces which face each other. Further, the first structural layer and the second structural layer have the rough surfaces with different degrees of roughness. Therefore, buckling of the structural layer which is to be a moving portion by a capillary phenomenon when the sacrifice layer is removed by wet etching can be prevented.

Further, by using a film formed by CVD as the second structural layer, a step of forming unevenness in a surface of the sacrifice layer can be omitted, thereby shortening manufacturing time.

Further, since protrusions are provided in the second structural layer which functions as a movable portion which can be displaced partially or wholly, an internal stress can be dispersed. Consequently, the movable portion of the microstructure can be moved more easily and durability of the movable portion can be improved.

Note that this embodiment mode can be combined with Embodiment Mode 1.

Embodiment Mode 4

This embodiment mode will describe one example of a manufacturing method of a structure provided with an opening with reference to FIGS. 5A to 5D and 6A to 6C. Note that the structure and manufacturing method other than providing an opening in the second structural layer are similar to those in Embodiment Mode 2 or 3.

Figure 5A:
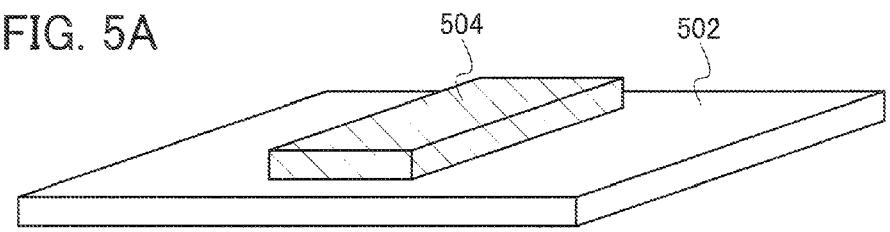
FIGS. 5A to 5D are exemplary diagrams showing one example of a microstructure of the present invention.

First, a first structural layer 502 is formed over an insulating substrate. Next, a sacrifice layer 504 is formed over the first structural layer 502 (FIG. 5A). Note that the substrate is omitted in FIGS. 5A to 5D.

The first structural layer 502 and the sacrifice layer 504 may be manufactured similarly to those in Embodiment Mode 2 or 3. Specifically, a crystalline semiconductor film in which a surface has a plurality of protrusions is formed as the first structural layer 502. In addition, the sacrifice layer 504 is formed of tungsten, molybdenum, or aluminum, and a plurality of protrusions is formed in its surface. That is, each surface of the first structural layer and the sacrifice layer is rough. The rough surfaces of the first structural layer and the sacrifice layer are different in roughness.

Figure 5B:
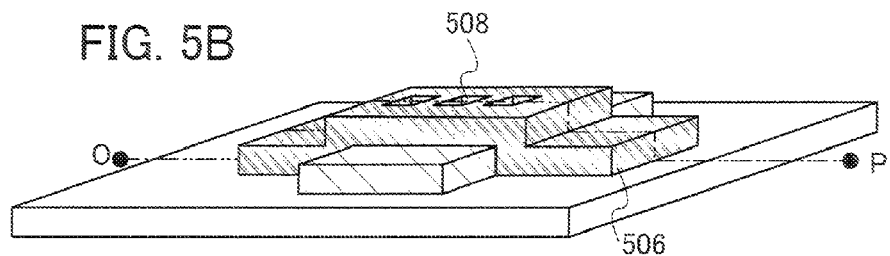

Next, a second structural layer 506 is formed over the sacrifice layer 504 (FIG. 5B). The second structural layer 506 may also be formed similarly to Embodiment Mode 2 or 3.

Figure 5C:
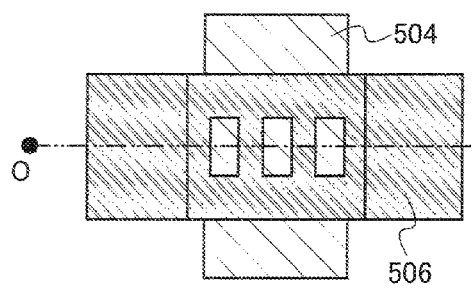
Figure 5D:
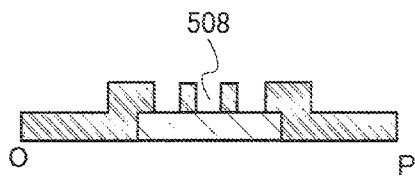

In this embodiment mode, an opening 508 is provided in forming the second structural layer 506. Note that the shape, size, and number of the openings 508 provided in the second structural layer 506 are not particularly limited. Further, in the case where a plurality of the openings is provided, the shape, size, or the like is not necessarily uniform. FIG. 5C is a top view of the sacrifice layer 504 and the second structural layer 506 provided with the opening 508, and FIG. 5D is a cross-sectional view thereof taken along a line O-P. Note that the first structural layer 502 is omitted in FIGS. 5C and 5D.

Figure 6A:
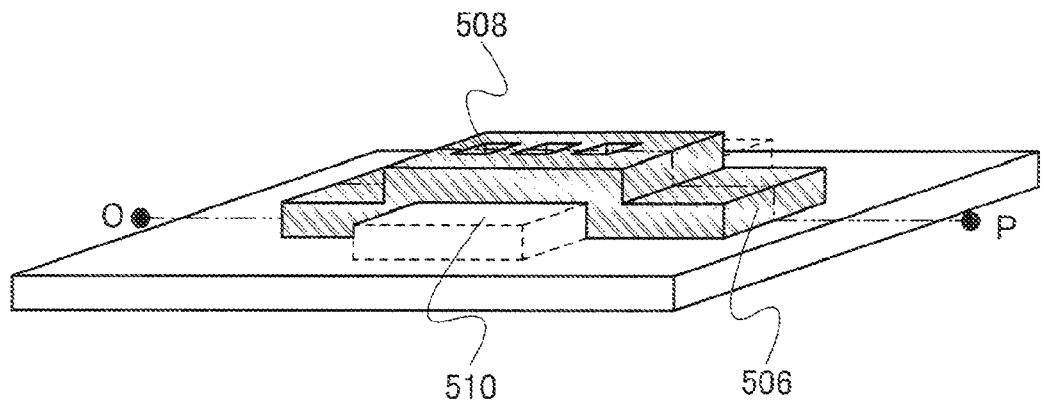
FIGS. 6A to 6C are exemplary diagrams showing one example of a microstructure of the present invention.
Figure 6B:
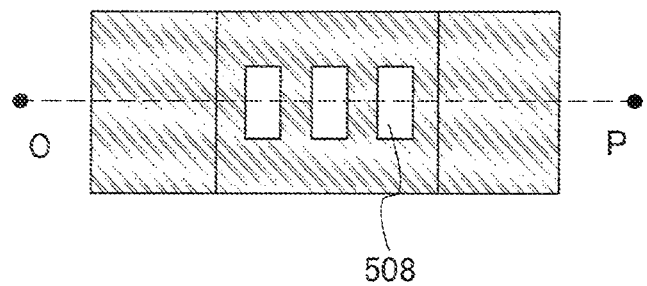
Figure 6C:
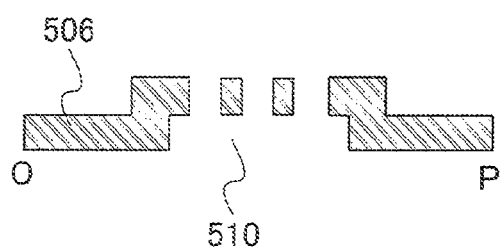

Next, the sacrifice layer 504 is removed (FIG. 6A). FIG. 6B is a top view of the second structural layer 506 after the removal of the sacrifice layer 504, and FIG. 6C is a cross-sectional view thereof taken along a line O-P. The etching method of the sacrifice layer is similar to that in Embodiment Mode 2 or 3. By etching the sacrifice layer, a space portion 510 is formed. Consequently, a microstructure having a space can be obtained.

By providing an opening in the second structural layer as described in this embodiment mode, etching time of the sacrifice layer can be shortened. Further, since the first structural layer and the second structural layer have rough surfaces which face each other, buckling of the structural layer can be prevented.

Note that this embodiment mode can be freely combined with any of the above embodiment modes.

Embodiment Mode 5

This embodiment mode will describe examples of wet etching of a sacrifice layer with reference to FIGS. 7A to 7D.

In the present invention, in the case where tungsten or molybdenum is used for the sacrifice layer, an ammonia peroxide mixture can be used as an etchant. In the case where wet etching using an ammonia peroxide mixture or the like is employed for etching the sacrifice layer in this manner, etching time of the sacrifice layer can be shortened by vibrating a substrate or a container for etching or by making the etchant flow. Hereinafter, examples of wet etching will be described with reference to FIGS. 7A to 7D.

As shown in FIGS. 7A to 7D, a container 421 included in a wet etching apparatus 420 is filled with a liquid etchant 423 such as an ammonia peroxide mixture. A substrate 422 is disposed in the container 421. That is, the substrate is soaked in the etchant 423.

The substrate 422 before the soak in the etchant 423 is provided with at least a sacrifice layer and a structural layer (a second structural layer) over the sacrifice layer. The substrate 422 is held by a substrate support 424 in the container 421.

Figure 7A:
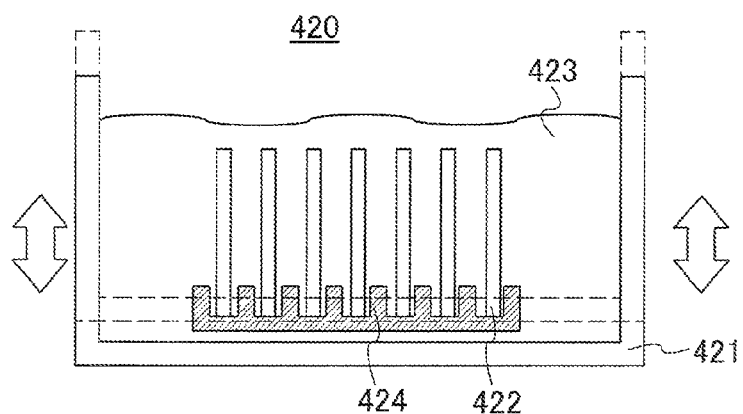
FIGS. 7A to 7D are diagrams each showing an example of wet etching.
Figure 7B:
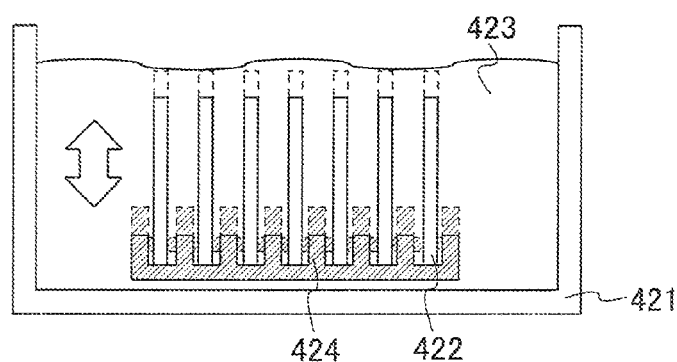

In FIG. 7A, in order to make the etchant 423 flow, the container 421 is vibrated. On the other hand, in FIG. 7B, in order to make the etchant 423 flow, the substrate support 424 instead of the container 421 is vibrated.

Figure 7C:
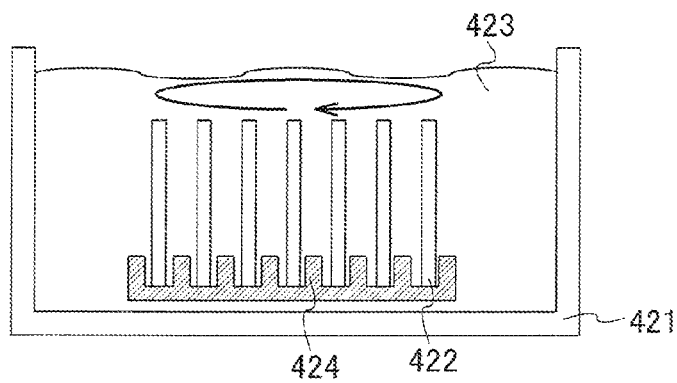
Figure 7D:
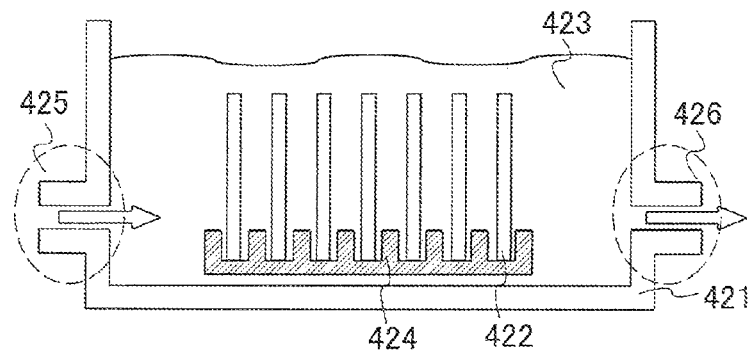

In FIG. 7C, in order to make the etchant 423 flow, the etchant 423 is agitated. Further, in FIG. 7D, an inlet 425 and an outlet 426 of the etchant 423 are provided for the container 421 to inject and eject the etchant 423, thereby flowing the etchant 423.

By making the etchant flow as described above, etching time of the sacrifice layer can be shortened. Further, efficient reaction to the etchant can be achieved, thereby the sacrifice layer can be prevented from remaining.

Note that this embodiment mode can be freely combined with any of the above embodiment modes.

Embodiment Mode 6

This embodiment mode will describe an example of a method for manufacturing a semiconductor device of the present invention. In accordance with the semiconductor device of the present invention, a microstructure and a semiconductor element are formed over an insulating surface. Here, description will be made on a method for manufacturing a microstructure and a semiconductor element over the same substrate with reference to the drawings. In each of the drawings, a top view is above and a cross-sectional view taken along a line O-P, O'-P, or Q-R is below. In addition, a region where the semiconductor element is formed is referred to as an element region 800a and a region where the microstructure is formed is referred to as a structure region 800b. Note that a structure of a substrate, a base insulating film, or the like is partially omitted in each top view.

First, a substrate having an insulating surface 801 is prepared. Here, the substrate having an insulating surface 801 is a glass substrate, a quartz substrate, a plastic substrate, or the like. Further, a substrate in which a layer is formed using an insulating material on a conductive substrate formed of an metal element or the like or a semiconductor substrate formed of silicon or the like can also be used. In the case where the microstructure and the semiconductor element are formed over a plastic substrate, a lightweight and thin semiconductor device having high flexibility can be manufactured. In addition, a lightweight and thin semiconductor device can also be formed by thinning a glass substrate by polishing from the rear side, or the like after the semiconductor device is manufactured over the glass substrate. In this embodiment mode, a glass substrate is used.

Next, a base insulating film 802 is formed over the substrate 801 (FIGS. 8A1 and 8A2). The base insulating film 802 can be formed with a single-layer structure or a multi-layer structure by using an insulating material such as silicon oxide, silicon nitride, or silicon oxynitride. Further, the base insulating film 802 may be formed using plasma CVD, low pressure CVD, sputtering, PVD, or the like. The case where a two-layer structure is employed for the base insulating film 802 will be described in this embodiment mode.

As the first layer of the base insulating film 802, a silicon oxynitride film is formed at a thickness of 10 nm or more and 200 nm or less (preferably 50 nm or more and 100 nm or less). The silicon oxynitride film can be formed by plasma CVD using $SiH_4$, $NH_3$, $N_2O$, and $H_2$ as reaction gases. Next, as the second layer of the base insulating film 802, a silicon oxynitride film is formed at a thickness of 50 nm or more and 200 nm or less (preferably 100 nm or more and 150 nm or less). The silicon oxynitride film can be formed by plasma CVD using $SiH_4$ and $N_2O$ as reaction gases.

Next, a semiconductor film which is to be a semiconductor layer 804 for forming the semiconductor element and a first structural layer 806 for forming the microstructure is formed (FIGS. 8A1 and 8A2). The semiconductor film (the semiconductor layer 804 and the first structural layer 806 are collectively referred to as a semiconductor film) can be obtained by forming an amorphous silicon film and crystallizing the amorphous silicon film. Specific description thereof will be made below.

First, an amorphous silicon film is formed at a thickness of 40 nm to 60 nm over the base insulating film 802 by sputtering, LPCVD, plasma CVD, or the like.

Next, the amorphous silicon film is irradiated with a laser beam to be crystallized. Alternatively, irradiation with a laser beam can also be combined with heat treatment with a heating furnace or RTA (Rapid Thermal Annealing), or the like to crystallize the amorphous silicon film.

For the irradiation of a laser beam, a CW laser beam or a pulsed laser beam can be used. As the laser beam, a laser beam emitted from one or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. For example, a second harmonic (532 nm) or a third harmonic (355 nm) of an Nd:$YVO_4$ laser (fundamental wave: 1064 nm) can be used. The laser irradiation requires a power density of approximately 0.01 to 100 $MW/cm^2$ (preferably 0.1 to 10 $MW/cm^2$). The laser is emitted at a scanning rate of approximately 10 to 2000 cm/sec.

Note that a fundamental wave of a CW laser and a harmonic of a CW laser may be used for the irradiation, or a fundamental wave of a CW laser and a harmonic of a pulsed laser may be used for the irradiation. By irradiating with a plurality of laser beams, a wide energy region can be compensated. Further, it is also possible to use a pulsed laser beam with a repetition rate such that the amorphous silicon film melted by a laser beam can be irradiated with the next pulsed laser beam before being solidified. By using a laser beam with such a repetition rate, a semiconductor film (a crystalline silicon film) in which crystal grains are grown continuously in the scan direction can be obtained. Such a repetition rate of a pulsed laser beam is specifically 10 MHz or higher, which is much higher than the generally used frequency band of the several tens to several hundreds of Hz. In a surface of the semiconductor film (crystalline silicon film) obtained by irradiation with such a laser beam, unevenness called ridges are formed, thereby making the surface rough. That is, the semiconductor film which is to be the first structural layer 806 is subjected to surface roughening by laser beam irradiation, so that a surface of the first structural layer 806 becomes rough. In the case where a protrusion formed here is referred to as a protrusion A, protrusions A are formed so that a distance between vertexes of the adjacent protrusions A is 0.2 μm or more and 1 μm or less.

It the above laser crystallization step, a metal element of promoting crystallization of the amorphous silicon film can also be used. For example, nickel (Ni) is added into the amorphous silicon film to perform the crystallization step. By performing heat crystallization using a metal element as described above, the heat temperature for performing crystallization can be reduced. In addition, a semiconductor film having a continuous crystal grain boundary can be obtained. Here, as the metal element of promoting crystallization, iron (Fe), ruthenium (Ru), rhodium (Rh), palladium (Pd), osmium (Os), iridium (Ir), platinum (Pt), copper (Cu), gold (Au), or the like can also be used as well as nickel. Such an element can be added into the amorphous silicon film by a coating method such as spin coating or dip coating. Other than that, plasma CVD, sputtering, vapor deposition, or the like can also be used.

Since the metal element of promoting crystallization could be a contaminant of a semiconductor device, a gettering step of removing the metal element is preferably performed after the amorphous silicon film is crystallized. In the gettering step, after the amorphous silicon film is crystallized, a layer to be a gettering sink is formed on the silicon film. Then heat treatment is performed to move the metal element into the gettering sink. A polycrystalline semiconductor layer or a semiconductor layer added with impurities can be used as the gettering sink. For example, a polycrystalline semiconductor layer added with an inert element such as argon may be formed on the silicon film, and can be used as a gettering sink. By adding an inert element, distortion can be generated in the polycrystalline semiconductor layer, and the metal element can be more efficiently captured. Alternatively, the metal element can be captured by forming a semiconductor layer added with an element such as phosphorus.

Note that the amorphous silicon film may contain hydrogen depending on a film-forming method. In such a case, in order not to spew the hydrogen by the laser beam irradiation, heat treatment is preferably performed so that the hydrogen of the silicon film is exhausted.

In this embodiment mode, an amorphous silicon film is formed at a thickness of approximately 50 nm by plasma CVD. Then, a nickel acetate solution containing 1 to 100 ppm (preferably 10 ppm) by weight of nickel is applied to an entire surface of the amorphous silicon film by spin coating.

Next, by RTA, heat treatment at 750° C. for 3 minutes is performed. Further, irradiation with an excimer laser ($\lambda$=308 nm) is performed at a scanning rate of 2.5 mm/sec, 60 Hz, and an energy density of 310 mJ/cm$^2$, so that a crystalline silicon film can be obtained.

Next, gettering of nickel contained in the crystalline silicon film is performed. First, an amorphous semiconductor film for gettering containing argon is formed at a thickness of 20 to 250 nm over the crystalline silicon film. Here, plasma CVD is used to form the amorphous semiconductor film. Although argon is added into the amorphous semiconductor film for gettering in this embodiment mode, another rare gas element, e.g., an element such as helium (He), neon (Ne), krypton (Kr), or xenon (Xe) can also be used.

Next, by thermal crystallization using RTA, heat treatment at 750° C. for 3 minutes is performed. In this step, nickel contained in the crystalline silicon film is moved into the amorphous semiconductor film for gettering. Note that the heat treatment for gettering can also employ a heating furnace, laser irradiation, an annealing furnace, or the like.

Further, before the amorphous semiconductor film for gettering is formed, heat treatment may also be performed. By performing heat treatment before the amorphous semiconductor film for gettering is formed, distortion of the crystalline silicon film can be reduced. Consequently, the gettering of nickel (a catalytic element) in the gettering step can be performed easily.

Next, the amorphous semiconductor film for gettering is selectively etched to be removed. The etching may be performed by dry etching using $ClF_3$ without using plasma, wet etching using an alkali solution such as a solution containing fluorinated acid, hydrazine, tetramethylammoniumhydroxide (($CH_3$)$_4$NOH), or the like. Through the above steps, a semiconductor film (a crystalline silicon film) in this embodiment mode can be obtained.

Next, a first sacrifice layer 808 for structuring a microstructure is formed over the semiconductor film forming the first structural layer 806 later (FIGS. 8A1 and 8A2). The first sacrifice layer 808 is provided for forming a space included in the microstructure. That is, by removing the sacrifice layer by etching or the like, a space is formed in the microstructure. The space which is formed above or below a structural layer having a movable portion can also be referred to as a space portion which is in contact with the structural layer having a movable portion.

The first sacrifice layer 808 can be formed of a material such as an element or a compound of tungsten, molybdenum, titanium, or the like by sputtering, CVD, or the like. Then, surface roughening is performed to the film formed using the above-described material, so that a surface thereof is made to be rough. Here, the surface roughening is performed to the film which is to be the first sacrifice layer 808, by irradiation with a laser beam, thereby forming a plurality of unevenness in the surface so that the surface thereof is made to be rough. In the case where a protrusion formed here is referred to as a protrusion B, protrusions B can be formed so that a distance between vertexes of the adjacent protrusions B is 0.02 μm or more and 0.1 μm or less.

In this embodiment mode, a tungsten film is formed at a thickness of approximately 400 nm as the first sacrifice layer 808, which is irradiated with a YAG laser ($\lambda$=1064 nm) at an output of 150 W and a scanning rate of 100 mm/sec.

Further, aluminum may also be used for the first sacrifice layer 808. In this case, by performing heat treatment to a film using aluminum, surface roughening is performed so that unevenness is formed in a surface thereof, thereby making the surface rough. Further, as another method of the surface roughening other than the heat treatment, a current can be supplied selectively to the film using aluminum so that unevenness is formed to make a surface thereof rough.

Next, the first sacrifice layer 808 is processed into a desired shape by photolithography and etching. Note that the laser irradiation to the first sacrifice layer 808 can also be performed after the first sacrifice layer 808 is processed into a desired shape.

The thickness of the first sacrifice layer 808 can be determined considering various factors such as the material of the first sacrifice layer 808, the structure and operating method of the microstructure, the method or etchant of etching the sacrifice layer, or the like. For example, in the case where the sacrifice layer is too thin, the etchant cannot be dispersed so that the sacrifice layer is not etched completely. Meanwhile, in the case where the sacrifice layer is too thick, a space formed by removing the sacrifice layer is large; therefore, when the microstructure is operated by electrostatic force, the microstructure in which the space is too large cannot be driven by the electrostatic force. In consideration of these factors, in the case where a microstructure which is operated by electrostatic force between the first structural layer 806 formed below the first sacrifice layer 808 and a second structural layer formed later above the first sacrifice layer 808 is formed, the first sacrifice layer 808 has preferably a thickness of 0.5 μm or more and 3 μm or less. More preferably, the first sacrifice layer 808 may have a thickness of 1 μm or more and 2 μm or less.

Further, in the case where a material having a large internal stress or a material having a poor adhesiveness by which the material easily peels from a semiconductor film (the first structural layer 806) is used for the first sacrifice layer 808, it is not possible to form a thick layer at one time. When forming the first sacrifice layer 808 by using such a material, film formation and patterning using both of photolithography and etching can also be repeated to thicken the first sacrifice layer 808.

Next, the semiconductor film is processed into a desired shape so that the semiconductor layer 804 and the first structural layer 806 are formed (FIGS. 8A1 and 8A2). Note that although the semiconductor film is patterned to form the semiconductor layer 804 and the first structural layer 806 after the first sacrifice layer 808 is formed in this embodiment mode, the present invention is not limited to this. For example, after the semiconductor film is patterned to form the semiconductor layer 804 and the first structural layer 806, the first sacrifice layer 808 may be formed.

Next, a first insulating layer 809 is formed over the semiconductor layer 804, the first structural layer 806, and the first sacrifice layer 808. Note that the first insulating layer 809 which is formed in the element region 800a is referred to as a gate insulating layer 810 and the first insulating layer 809 which is formed in the structure region 800b is referred to as a second structural layer A 812 (FIGS. 8B1 and 8B2). In this time, a surface where the second structural layer A 812 is in contact with the under first sacrifice layer 808 becomes a surface along the rough surface of the first sacrifice layer. That is, unevenness is formed in a surface of the second structural layer A 812 in accordance with the unevenness formed in the first sacrifice layer 808, so that the surface is made to be rough.

The first insulating layer 809 (the gate insulating layer 810 and the second structural layer A 812 are collectively referred to as the first insulating layer 809) can be formed using an insulating material such as silicon oxide, silicon nitride, or silicon oxynitride by plasma CVD or sputtering, similarly to the base insulating film 802. In this embodiment mode, a silicon oxynitride film (composition ratio: Si=32%; O=59%; N=7%; H=2%) is formed at a thickness of approximately 50 nm by plasma CVD. It is needless to say that the first insulating layer 809 is not limited to the silicon oxynitride film, and a single-layer structure or a multi-layer structure of another insulating layer may also be used.

As a further alternative material for the first insulating layer 809, metal oxide having a high dielectric constant, such as hafnium (Hf) oxide can be used. By forming the first insulating layer 809 using such a high dielectric constant material, the semiconductor element can be driven at a low voltage so that a low-power consumption semiconductor device can be provided.

Further, the first insulating layer 809 can also be formed by high-density plasma treatment. High-density plasma treatment is a plasma treatment in which the plasma density is $1 \times 10^{11}$ cm$^3$ or more, and preferably in the range of $1 \times 10^{11}$ cm$^3$ to $9 \times 10^{15}$ cm$^3$ inclusive, and a high frequency wave such as a microwave (e.g., a frequency of 2.45 GHz) is used. In the case where plasma is generated with such a condition, the electron temperature becomes as low as 0.2 eV or more and 2 eV or less. The high-density plasma having a feature of a low electron temperature has a low kinetic energy of an activated species; therefore, a film can be formed with few plasma damage and few defect.

The substrate (an object to be formed) over which the semiconductor layer 804, the first structural layer 806, and the first sacrifice layer 808 are formed is disposed in a film-forming chamber capable of such plasma treatment. Then, the distance between an electrode for generating plasma, namely an antenna and the object to be formed is set to be 20 mm to 80 mm, and preferably 20 mm to 60 mm, and then film-forming treatment is performed. Such high-density plasma treatment enables a low temperature process (a substrate temperature of 400° C. or less) to be achieved. Therefore, glass or plastic of which heat resistance is low can be used as the substrate 801.

As a film-forming atmosphere of such a first insulating layer 809, a nitrogen atmosphere or an oxygen atmosphere can be used. The nitrogen atmosphere is typically a mixed atmosphere of nitrogen and a rare gas or a mixed atmosphere of nitrogen, hydrogen and a rare gas. As the rare gas, at least one of helium, neon, argon, krypton, and xenon can be used. The oxygen atmosphere is typically a mixed atmosphere of oxygen and a rare gas, a mixed atmosphere of oxygen, hydrogen, and a rare gas, or a mixed atmosphere of dinitrogen monoxide and a rare gas. As the rare gas, at least one of helium, neon, argon, krypton, and xenon can be used.

By using such a step, the first insulating layer 809 which does not damage another coating film so much and is dense can be formed. In addition, the insulating layer formed by the high-density plasma treatment can improve the state of an interface with a layer which is in contact with the insulating layer. That is, by employing the high-density plasma treatment, the state of an interface between the first insulating layer 809 which is to be the gate insulating layer 810 and the semiconductor layer 804 can be improved. Consequently, the electrical property of the semiconductor element can be improved. In addition, the state of an interface between the first insulating layer 809 which is to be the second structural layer A 812 and the first structural layer 806 can also be improved, thereby the microstructure including the second structural layer A 812 which is high in strength can be manufactured.

The description is made here on the case where the high-density plasma treatment is used for forming the first insulating layer 809; however, the high-density plasma treatment may also be performed to, for example, the semiconductor layer 804 and the first structural layer 806. By the high-density plasma treatment, quality modification of surfaces of the semiconductor layer 804 and the first structural layer 806 can be performed. Consequently, the electrical property of the semiconductor element and the durability of the microstructure can be improved. The high-density plasma treatment can be further employed for forming the base insulating film 802 or another insulating layer as well as for forming the first insulating layer 809.

Next, a gate electrode layer 814 for structuring the semiconductor element is formed over the first insulating layer 809. The gate electrode layer 814 is formed with a multi-layer structure of a first conductive layer 813 and a second conductive layer 815. At the same time, a second structural layer B 816 and a second sacrifice layer 817 for structuring the microstructure are also formed. The second structural layer B 816 is formed of the first conductive layer 813 while the second sacrifice layer 817 is formed of the second conductive layer 815 (FIGS. 8B1 and 8B2). Each of the first conductive layer 813 and the second conductive layer 815 for structuring the gate electrode layer 814 or the like can be formed of a conductive metal element such as tungsten (W) or tantalum (Ta) or a metal compound by sputtering, CVD, or the like. In this embodiment mode, tantalum (Ta) is used for the first conductive layer 813 and tungsten (W) is used for the second conductive layer 815. Note that the gate electrode layer 814 can also be formed with a single-layer structure. In this case, the second sacrifice layer 817 is formed without forming the second structural layer B 816.

Note also that the second structural layer B 816 and the second structural layer A 812 formed of the first insulating layer 809 which has been formed before are collectively referred to as a second structural layer of a microstructure of the present invention. The second structural layer B 816 is, however, not necessarily formed in the case where the gate electrode layer 814 is not formed with a multi-layer structure. In this case, the second structural layer is formed of only the first insulating layer 809 (the second structural layer A 812).

Further, in the case where the second sacrifice layer 817 is etched at the same time as the first sacrifice layer 808, it is desirable that the second sacrifice layer 817 be formed of the same material as that of the first sacrifice layer 808. However, the present invention is not limited to such a material, and the first sacrifice layer 808 and the second sacrifice layer 817 may be manufactured with the same material or different materials.

The gate electrode layer 814, the second structural layer B 816, and the second sacrifice layer 817 can be obtained by processing the first conductive layer 813 and the second conductive layer 815 into desired shapes by photolithography and etching. In the case where dry etching is employed as the etching, for example, ICP (Inductively Coupled Plasma) etching can be employed. As an etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used. Further, in the case where the first conductive layer or the second conductive layer is formed of a plurality of conductive materials, the first conductive layer or the second conductive layer can be etched by appropriately adjusting an etching condition (e.g., electric power applied to a coil-shaped electrode, electric power applied to an electrode on the substrate 801 side, or an electrode temperature on the substrate 801 side).

Next, a first N-type impurity region 818 is formed by adding an N-type impurity element into the semiconductor layer 804 for structuring the semiconductor element. Here, the impurity element is selectively added by using the gate electrode layer 814 as a mask. In addition, on a region where a P-type semiconductor element is formed later, a resist mask 870 is formed in advance. In this manner, each of an N-type impurity region and a P-type impurity region can be selectively formed by forming a resist mask by photolithography and adding an impurity element. For example, when an N-type impurity region is formed, a region for forming a P-type impurity region may be covered with a resist mask or the like. Similarly, when a P-type impurity region is formed, a region for forming an N-type impurity region may be covered with a resist mask or the like. As a method of adding the impurity element, ion doping or ion implantation can be employed. As the impurity element imparting N-type conductivity, phosphorus (P) or arsenic (As) can be typically used, and as the impurity element imparting P-type conductivity, boron (B) can be used.

Next, an insulating layer is formed of a nitrogen compound such as silicon nitride or oxide such as silicon oxide by plasma CVD or the like. Then, the insulating layer is anisotropically etched in a perpendicular direction, thereby forming an insulating layer (hereinafter referred to as a sidewall) 822 in contact with a side surface of the gate electrode layer 814. Note that in this step, at the same time, a sidewall 824 which is in contact with side surfaces of the second structural layer B 816 and the second sacrifice layer 817 can also be formed (FIGS. 9A1 and 9A2).

Next, an N-type impurity element is added into the semiconductor layer 804 by using the gate electrode layer 814 and the sidewall 822 as a mask, thereby forming a second N-type impurity region 826 and a third N-type impurity region 828. Note that the semiconductor layer 804 under the gate electrode layer 814 becomes a channel forming region 820.

Next, a resist mask is formed on a region where an N-type semiconductor element is formed and a P-type impurity element is added into the semiconductor layer 804, thereby forming a first P-type impurity region 829. The semiconductor layer 804 under the gate electrode layer 814 and the sidewall 822 becomes a channel forming region 821. Each of an N-type impurity region and a P-type impurity region can be selectively formed by forming a resist mask by photolithography and adding an impurity element.

Note that the second N-type impurity region 826 corresponds to a low-concentration impurity region (LDD: Lightly Doped Drain) and is disposed under the sidewall 822.

Note also that the third N-type impurity region 828 is a high-concentration impurity region which contains the impurity element at a higher concentration than that of the second N-type impurity region 826, and corresponds to a source region or a drain region. The third N-type impurity region 828 is a region which is not overlapped with the gate electrode layer 814 and the sidewall 822 with the gate insulating layer 810 interposed therebetween.

By providing difference in impurity concentration of the semiconductor layer 804 in this way using the sidewall 822, a short-channel effect caused as the gate length of a semiconductor element is shortened can be prevented.

In addition, in the case where the gate electrode layer 814 is manufactured by stacking different conductive materials so as to have a tapered shape, it is not necessary to form the sidewall 822. In this case, the low-concentration impurity region (LDD region) and the high-concentration impurity region (source or drain region) can be formed by adding an impurity element once.

Next, heat treatment, infrared light irradiation, or laser beam irradiation is performed to activate the impurity elements. In addition, at the same time as the activation, plasma damage to the first insulating layer 809 or plasma damage to the interface between the first insulating layer 809 and the semiconductor layer 804 can be recovered. In particular, by performing the activation of the impurity elements from a top surface or a rear surface with an excimer laser in an atmosphere at a temperature of room temperature to 300° C., efficient activation can be performed. Further, the activation may also be conducted by irradiation with a second harmonic of a YAG laser. A YAG laser is a favorable activation means because it does not requires maintenance so often.

Further, hydrogenation can also be performed by heat treatment, infrared light irradiation, or laser beam irradiation after a passivation film is formed of an insulating layer of silicon oxynitride or silicon oxide over the first insulating layer 809. For example, a silicon oxynitride film is formed at a thickness of 100 nm by plasma CVD, and then heat treatment is performed using a clean oven at 300 to 550° C. for 1 to 12 hours, thereby hydrogenating the semiconductor layer. For example, heat treatment is performed using a clean oven in a nitrogen atmosphere at 410° C. for 1 hour. This step can terminate dangling bonds in the semiconductor layer 804 caused by addition with the impurity elements, with hydrogen contained in the passivation film. At the same time, the aforementioned activation treatment of the impurity regions can also be performed.

Through the above steps, an N-type semiconductor element 830 and a P-type semiconductor element 832 are formed (FIGS. 9A1 and 9A2). Note that although the N-type semiconductor element and the P-type semiconductor element are manufactured in this embodiment mode, the present invention is not limited to this and change is possible as appropriate in accordance with its purpose. For example, all of the semiconductor elements may be N-type semiconductor elements or P-type semiconductor elements.

Note that although the low-concentration impurity region is provided only in the N-type semiconductor element 830 in this embodiment mode, the low-concentration impurity region can also be provided in the P-type semiconductor element 832.

Further, in this embodiment mode, no impurity element is added into the first structural layer 806 for structuring the microstructure, by using the resist mask or the like. It is needless to say that an impurity region may also be formed in a region of the first structural layer 806 which is not covered with the second sacrifice layer 817.

Then, a second insulating layer 834 is formed so as to cover the entire surface (FIGS. 9B1 and 9B2). The second insulating layer 834 can be formed of an insulating inorganic or organic material, or the like. As the inorganic material, silicon oxide, silicon nitride, or the like can be used. As the organic material, polyimide, acrylic, polyamide, polyimide amide, resist, benzocyclobutene, siloxane, or polysilazane can be used. A siloxane resin corresponds to a resin containing a Si—O—Si bond. Siloxane has a skeletal structure containing a bond of silicon (Si) and oxygen (O). As a substituent, an organic group containing at least hydrogen (e.g., an alkyl group or aromatic hydrocarbon) can be used. As a substituent, a fluoro group may also be used. Moreover, as a substituent, an organic group containing at least hydrogen and a fluoro group may also be used. Polysilazane is formed by using a polymer material having a bond of silicon (Si) and nitrogen (N) as a starting material.

Next, the second insulating layer 834 and the first insulating layer 809 (the gate insulating layer 810) are etched sequentially to form a first contact hole 836 (see FIGS. 9B1 and 9B2). As the etching, dry etching or wet etching can be employed. In this embodiment mode, the first contact hole 836 is formed by dry etching.

Next, a second conductive layer is formed over the second insulating layer 834 and in the first contact hole 836 and patterned into a desired shape by photolithography and etching, thereby forming a wiring 838 forming a source or drain electrode. At the same time, an upper electrode 839 of the microstructure is formed (see FIGS. 9B1 and 9B2). The second conductive layer which is to be the wiring 838 and the upper electrode 839 can be formed using a film of an element such as aluminum (Al), titanium (Ti), molybdenum (Mo), tungsten (W), or silicon (Si), or an alloy film using the element.

Next, the second insulating layer 834 and the first insulating layer 809 (the second structural layer A 812) are sequentially etched to form a second contact hole 840, thereby exposing the first sacrifice layer 808 and the second sacrifice layer 817 (FIGS. 10A1 and 10A2). It is to be noted that only the structure region 800*b* including the microstructure is shown in FIGS. 10A1 to 10B2.

As the etching, dry etching or wet etching can be employed. In this embodiment mode, the second contact hole 840 is formed by dry etching. The second contact hole 840 is opened in order to etch away the first sacrifice layer 808 and the second sacrifice layer 817. Therefore, the diameter of the second contact hole 840 is determined so that an etchant flows therethrough. For example, it is preferable that the diameter of the second contact hole 840 be 2 μm or more.

Further, the second contact hole 840 can also be formed as a contact hole having a large diameter so that the first sacrifice layer 808 and the second sacrifice layer 817 are easily etched. That is, it is not necessary to form the contact hole as small as that shown in FIGS. 10A1 and 10A2, and the second contact hole 840 may be formed so as to expose the whole second sacrifice layer 817 while leaving the portion where the second insulating layer 834 is necessary (e.g., the insulating layer just above the semiconductor element).

Next, the first sacrifice layer 808 and the second sacrifice layer 817 are removed by etching (FIGS. 10B1, 10B2, and 10C). The etching of the first sacrifice layer 808 and the second sacrifice layer 817 can be performed utilizing the second contact hole 840 by a wet etchant which is suitable for the material of each sacrifice layer or by dry etching. In the etching step, it is necessary to select an appropriate combination of materials for the first structural layer 806, the second structural layer A 812, and the second structural layer B 816, materials for the first sacrifice layer 808 and the second sacrifice layer 817, and an etchant for removing the sacrifice layers.

For example, in the case where each sacrifice layer is formed of tungsten (W), the etching can be performed by soaking for about 20 minutes in a solution in which 28 wt % of ammonia solution and 31 wt % of hydrogen peroxide solution are mixed at a ratio of 1:2. In the present invention, since a plurality of unevenness is formed in surfaces of the first structural layer and the second structural layer which face each other so that the surfaces are made to be rough, buckling of the microstructure by a capillary phenomenon at drying after wet etching can be prevented. In order to further prevent the bucking of the microstructure, rinse may be performed using an organic solvent with low viscosity (e.g., cyclohexane), drying may be performed at a low temperature and a low pressure, or the rinse and the drying may be combined preferably. Moreover, freeze drying is also effective.

Further, in order to prevent buckling of the microstructure by a capillary phenomenon, plasma treatment of providing a water-repellent property for a surface of the microstructure can also be performed. Further, the sacrifice layer can be etched by dry etching using $F_2$ or $XeF_2$ under a condition of atmospheric pressure or the like. Here, in the case where the first sacrifice layer 808 and the second sacrifice layer 817 are formed of different materials and cannot be etched with the same etchant, it is necessary to etch the sacrifice layers in two steps. In this case, the selectivity between the sacrifice layers and a layer which is in contact with the etchant but is not removed (e.g., the first structural layer 806 or the second insulating layer 834) is required to be considered sufficiently.

Using these steps, the first sacrifice layer 808 is removed to form a first space portion 842 and the second sacrifice layer 817 is etched away to form a second space portion 844, thereby manufacturing a microstructure 850 (FIGS. 10B1, 10B2, and 10C). Here, the microstructure 850 has the first space portion 842 which is provided between the first structural layer 806 and the second structural layer A 812, and has the second space portion 844 which is provided between the second structural layer B 816 and the second insulating layer 834 provided thereover. The second structural layer A 812 and the second structural layer B 816 of the microstructure 850 becomes movable the first space portion 842 and the second space portion 844.

Through the above-described steps, a semiconductor device 860 including a semiconductor element 852 and the microstructure 850 over the same substrate can be obtained.

As is in the above-described steps, crystallization can be carried out by laser crystallization or a combination of laser crystallization and nickel addition at a temperature lower than that in crystallization using only heat treatment. Thus, a material range applicable in the process can be widened. For example, in the case where the semiconductor layer is crystallized only by heat, the heating needs to be at approximately 1000° C. for approximately 1 hour; therefore a glass substrate sensitive to heat or a metal element with its melting point of 1000° C. or lower cannot be used. However, the above-described steps make it possible to use a glass substrate or the like having a distortion point of 593° C.

Further, the present invention can provide a semiconductor device which does not require assembling or packaging and which does not require high manufacturing cost, by manufacturing the microstructure and the semiconductor element over the same substrate.

Note that this embodiment mode can be freely combined with any of the above embodiment modes.

Embodiment Mode 7

Figure 14:
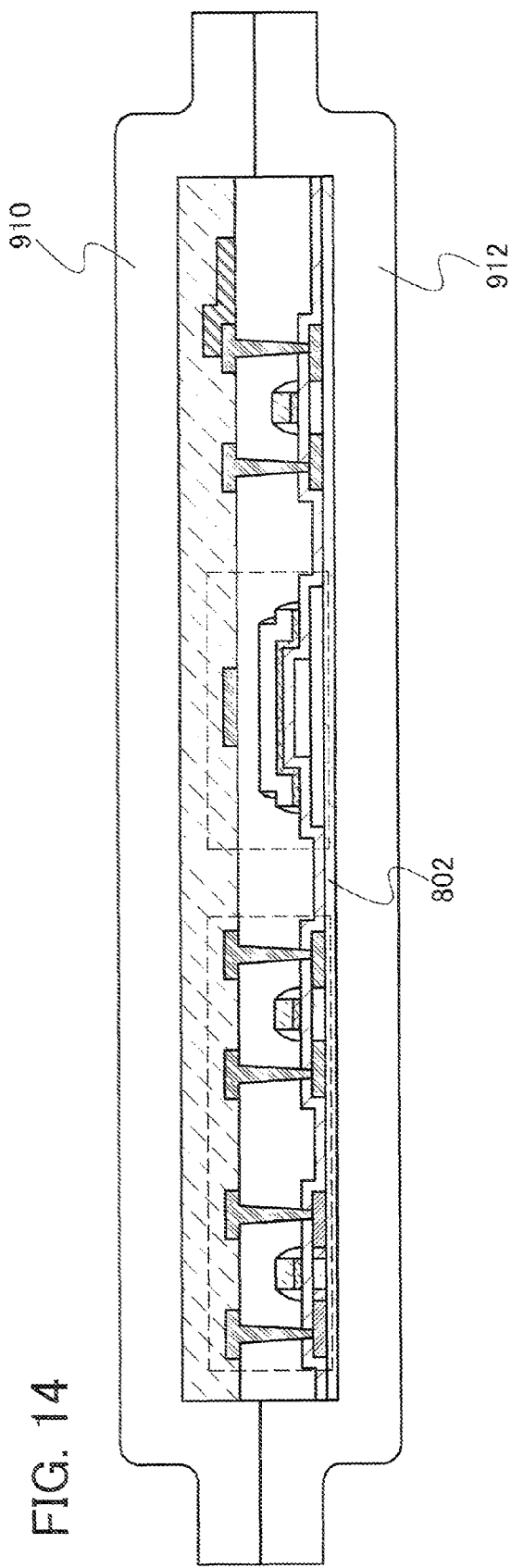
FIG. 14 is a diagram showing one example of a manufacturing method of a semiconductor device of the present invention.

This embodiment mode will describe a method in which a substrate is peeled from a semiconductor device of the present invention and attached to another substrate or a body, with reference to FIGS. 13A, 13B, and 14.

As shown is FIG. 13A, a semiconductor device 960 of the present invention includes the N-type semiconductor element 830, the P-type semiconductor element 832, and the microstructure 850 described in Embodiment Mode 6. The present invention further includes a peeling layer 902, a conductive layer 932 which functions as an antenna, and a semiconductor element 930 for controlling the conductive layer 932. The other structures are similar to that described in Embodiment Mode 6.

In the case where the semiconductor device 960 is peeled from the substrate 801, the peeling layer 902 is formed in manufacturing the base insulating film 802. The peeling layer 902 can be formed under or in the stacked base insulating film 802. As the peeling layer 902, a single layer or a plurality of layers is formed using a layer of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), and silicon (Si), or an alloy material or a compound material containing the above-described element as its main component, by sputtering, plasma CVD, or the like. The structure of the layer containing silicon may be any of amorphous, semicrystalline, and polycrystalline structures.

In the case where the peeling layer 902 has a single-layer structure, a tungsten layer, a molybdenum layer, or a layer containing a mixture of tungsten and molybdenum may be formed, for example. Alternatively, a layer containing oxide or oxynitride of tungsten, a layer containing oxide or oxynitride of molybdenum, or a layer containing oxide or oxynitride of a mixture of tungsten and molybdenum may be formed. Note that the mixture of tungsten and molybdenum is, for example, an alloy of tungsten and molybdenum. Further, oxide of tungsten may be referred to as tungsten oxide.

In the case where the peeling layer 902 has a multi-layer structure, a tungsten layer, a molybdenum layer, or a layer containing a mixture of tungsten and molybdenum may be formed as the first layer, and a layer containing oxide, nitride, oxynitride, or nitride oxide of tungsten, molybdenum, or a mixture of tungsten and molybdenum may be formed as the second layer.

When a multi-layer structure of a layer containing tungsten and a layer containing oxide of tungsten is formed as the peeling layer 902, a layer containing tungsten is formed and a layer containing silicon oxide is formed thereon so that oxide of tungsten formed at an interface between the tungsten layer and the silicon oxide layer. This is also applied to the case of forming a layer containing nitride, oxynitride, or nitride oxide of tungsten; after a layer containing tungsten is formed, a silicon nitride layer, a silicon oxynitride layer, or a silicon nitride oxide layer may be formed thereon. Oxide of tungsten is referred to as $WO_X$ and X is in the range of 2 to 3; there are $WO_2$ in the case where X is 2, $W_2O_5$ in the case where X is 2.5, $W_4O_{11}$ in the case where X is 2.75, $WO_3$ in the case where X is 3, and the like. When forming oxide of tungsten, the above value of X is not limited in particular, and composition of oxide can be determined based on an etching rate or the like. A layer containing oxide of tungsten ($WO_X$, $0<X<3$) which is formed by sputtering in an oxygen atmosphere is preferable to obtain the most preferable etching rate. Therefore, in order to shorten the manufacturing time, a layer containing oxide of tungsten is preferably formed by sputtering in an oxygen atmosphere, as the peeling layer. Alternatively, when the peeling layer is formed with a multi-layer structure of a metal layer and a layer containing a metal oxide, after the metal layer is formed, plasma treatment may be performed to the metal layer so that the metal oxide film is formed on the metal layer. By performing the plasma treatment in an oxygen atmosphere, a nitrogen atmosphere, a $N_2O$ atmosphere, or the like, a metal oxide film, a metal oxide nitride film, or the like can be formed on the metal film.

The semiconductor element 930 for controlling the conductive layer can be manufactured similarly to the N-type semiconductor element 830 or the P-type semiconductor element 832. Here, the semiconductor element 930 is the similar one to the P-type semiconductor element 832. The conductive layer 932 is formed in contact with a wiring included in the semiconductor element 930. The conductive layer 932 is formed of a conductive material by plasma CVD, sputtering, printing, or a droplet discharge method. Preferably, the conductive layer 932 is formed with a single layer or a plurality of layers using an element selected from aluminum (Al), titanium (Ti), silver (Ag), or copper (Cu), or an alloy material or a compound material containing the above-described element as its main component. Specifically, the conductive layer 932 can be formed by screen printing using a paste containing silver and heat treatment thereafter at 50° C. to 350° C. Alternatively, an aluminum layer may be formed by sputtering, and may be patterned by photolithography and etching to form the conductive layer 932. In the case where an aluminum layer is used, wet etching is preferably employed, and heat treatment at 200° C. to 300° C. is preferably performed after the wet etching.

Furthermore, in this embodiment mode, a third insulating layer 934 is formed over the semiconductor elements in order to protect the semiconductor device 960 in a later peeing step or the like. The third insulating layer 934 is formed of a layer containing carbon such as DLC (diamond-like carbon), a layer containing silicon nitride, a layer containing silicon nitride oxide, or an organic material, and is preferably formed of an epoxy resin.

Described next is a method of peeling the semiconductor device 960 from the substrate 801 (FIGS. 13A and 13B). There are various methods of peeling, and one example thereof will be described here. First, by irradiation with a laser beam (e.g., UV light), an opening 904 is formed in the third insulating layer 934, the second insulating layer 834, the first insulating layer 809, and the base insulating film 802. Then, by using physical force, the semiconductor device 960 can be peeled from the substrate 801. Alternatively, before peeling the substrate 801 from the semiconductor device 960, an etchant may be introduced into the opening 904 to remove the peeling layer 902. As the etchant, a gas or a liquid containing halogen fluoride or an interhalogen compound may be used. For example, chlorine trifluoride ($ClF_3$) is used as the gas containing halogen fluoride. Note that the peeling layer 902 may also be left partially without being removed completely; thereby suppressing consumption of the etchant and shortening processing time required for removing the peeling layer 902. In addition, the semiconductor device 960 can be held at the substrate 801 even after the removal of the peeling layer 902. It is preferable to reuse the substrate 801 after being peeled from the semiconductor device 960, for cost reduction.

Next, one surface of the semiconductor device 960 is attached to a first base 910 and the semiconductor device 960 is completely peeled from the substrate 801. Then, the other surface of the semiconductor device 960 is attached to a second base 912. After that, one or both of heat treatment and pressure treatment is performed so that the semiconductor device 960 is sealed with the first base 910 and the second base 912. Each of the first base 910 and the second base 912 is a film formed of polypropylene, polyester, vinyl, polyvinyl fluoride, vinyl chloride or the like, paper made of a fibrous material, a multi-layer film of a base film (e.g., polyester, polyamide, an inorganic evaporation film, or paper) and an adhesive synthetic resin film (e.g., an acrylic-based synthetic resin, or an epoxy-based synthetic resin), or the like.

Such a film is processed by thermal compression bond to a body to be processed. In the case where the heat treatment and the pressure treatment are performed, an adhesion layer provided on a surface of the film or a layer (which is not an adhesion layer) provided as the outermost layer of the film is melted by the heat treatment, and then attachment is performed by applying pressure. Note that an adhesion layer is not necessarily provided on a surface of each of the first base 910 and the second base 912. The adhesion layer corresponds to a layer containing an adhesive such as a thermosetting resin, a UV curing resin, an epoxy-based resin, or a resin additive.

Through the above-described steps, a flexible semiconductor device can be manufactured. Further, a thin, soft, and small semiconductor device having a microstructure can be obtained.

Note that this embodiment mode can be freely combined with any of the above embodiment modes.

Embodiment Mode 8

This embodiment mode will describe one example of a semiconductor device capable of wireless communication having a microstructure of the present invention.

Figure 11:
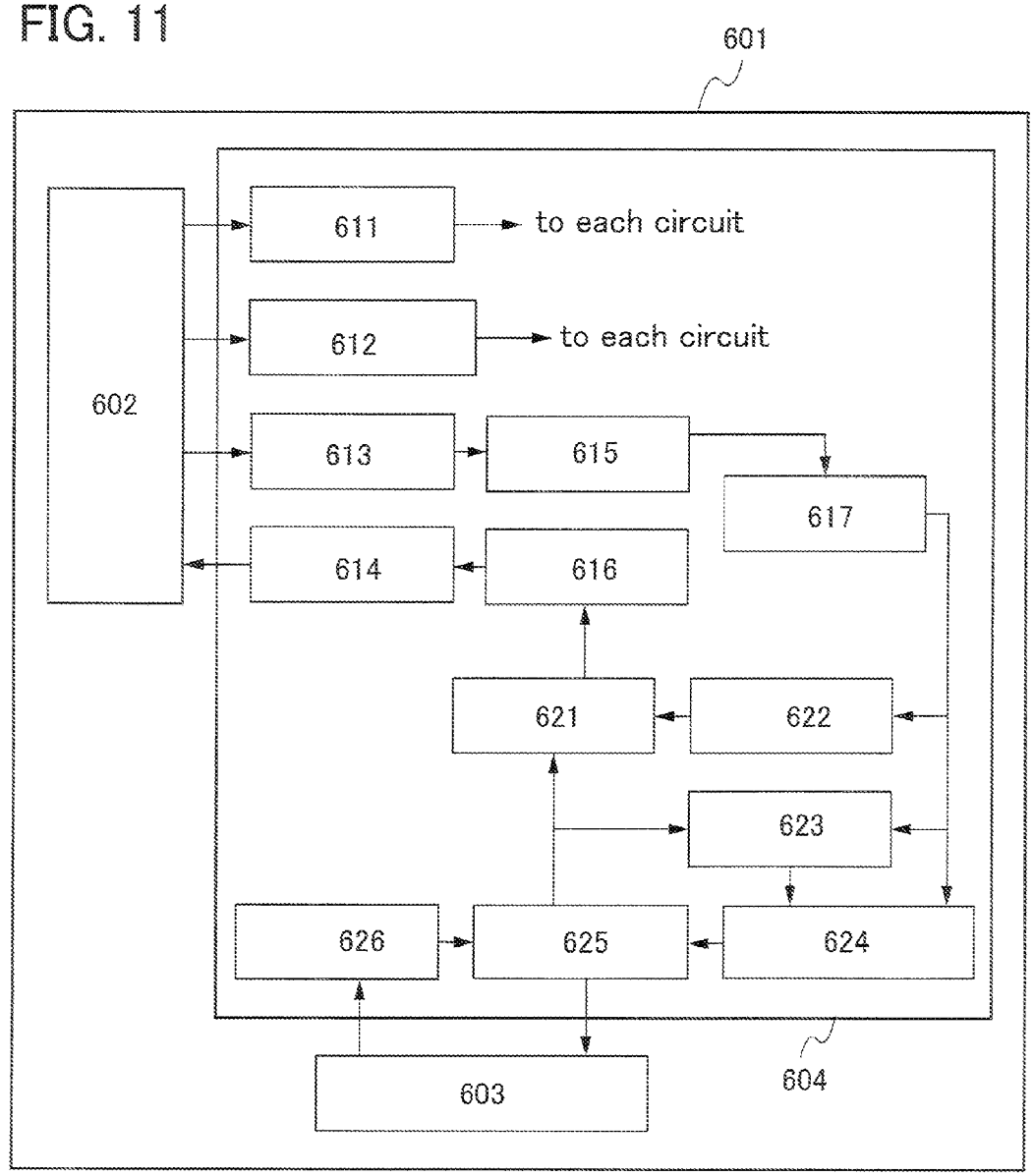
FIG. 11 is a diagram showing one example of a semiconductor device of the present invention.
Figure 12A:
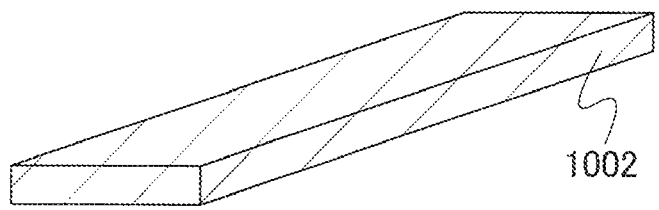
FIGS. 12A to 12D are diagrams showing one example of a manufacturing method of a conventional microstructure.
Figure 12B:
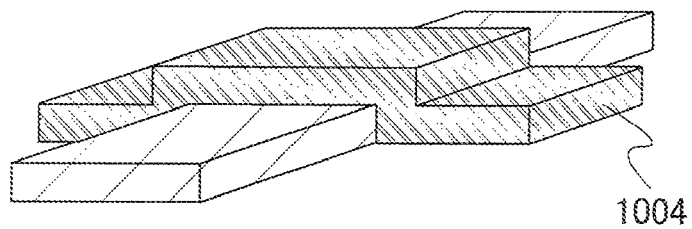
Figure 12C:
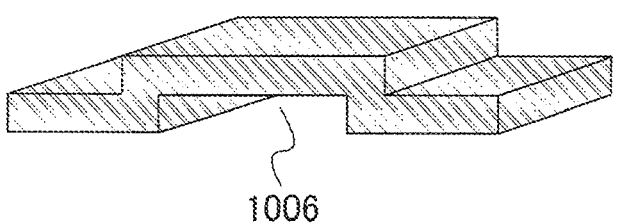
Figure 12D:
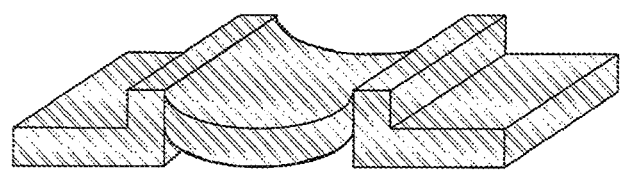

FIG. 11 shows a detailed structure of a semiconductor device 601. First, an electric circuit 604 included in the semiconductor device 601 will be described. The electric circuit 604 receives an electromagnetic wave emitted from an outside (here, corresponding to a reader/writer) to generate electric power for driving the semiconductor device 601, and communicates with the outside wirelessly. Therefore, the electric circuit 604 includes a power supply circuit 611, a clock generating circuit 612, a demodulating circuit 613, a modulating circuit 614, a decoding circuit 615, an encoding circuit 616, an information judging circuit 617, or the like, which are necessary for wireless communication. Further, the semiconductor device may employ a different circuit structure depending on the frequency of electromagnetic wave or the communication method used for the wireless communication, and arbitrary change is possible.

The electric circuit 604 has functions of controlling a microstructure 603, processing information from the reader/writer, and the like. Therefore, the electric circuit 604 includes a memory, a memory controlling circuit, an arithmetic circuit, and the like. In the example shown in FIG. 11, the electric circuit 604 includes a memory 621, a memory controlling circuit 622, an arithmetic circuit 623, a structure controlling circuit 624, an A/D converting circuit 625, and a signal amplifying circuit 626.

The power supply circuit 611 includes a diode and a capacitor and can hold a constant voltage by rectifying an AC voltage generated at an antenna 602 and supply the constant voltage to each circuit. The clock generating circuit 612 includes a filter element or a frequency dividing circuit, and can generate a clock with a required frequency based on the AC voltage generated at the antenna 602, and the clock can be supplied to each circuit.

Here, the frequency of the clock generated by the clock generating circuit 612 is basically set to be equal to or lower than a frequency of an electromagnetic wave with which the reader/writer and the semiconductor device 601 communicate with each other. Further, the clock generating circuit 612 may include a ring oscillator, thereby a clock with an arbitrary frequency can also be generated by inputting a voltage from the power supply circuit 611.

The demodulating circuit 613 includes a filter element and an amplifying circuit, so that a signal included in the AC voltage generated at the antenna 602 can be demodulated. The demodulating circuit 613 includes a circuit having a different structure depending on the modulation method used for the wireless communication. The decoding circuit 615 decodes a signal which has been demodulated by the demodulating circuit 613. This decoded signal is a signal which has been transmitted from the reader/writer. The information judging circuit 617 includes a comparing circuit or the like, and can judge whether the decoded signal is a correct signal that has been transmitted from the reader/writer. If the signal is judged as correct information, the information judging circuit 617 can send a signal showing that the signal is correct to each circuit (e.g., the memory controlling circuit 622, the arithmetic circuit 623, or the structure controlling circuit 624) and the circuit having received the signal can perform predetermined operation.

The encoding circuit 616 encodes data to be transmitted from the semiconductor device 601 to the reader/writer. The modulating circuit 614 modulates the encoded data and transmits to the reader/writer through the antenna 602.

The data to be transmitted to the reader/writer is data specific to the semiconductor device stored in the memory 621 or data obtained by a function of the semiconductor device. The data specific to the semiconductor device is, for example, data such as individual identification information stored in a non-volatile memory included in the semiconductor device. The data obtained by the function of the semiconductor device is, for example, data obtained by the microstructure, data to which certain calculation has been conducted based on the data, or the like.

The memory 621 can include a volatile memory or a nonvolatile memory, and stores data specific to the semiconductor device 601, information obtained from the microstructure 603, and the like. Although only one memory 621 is shown in FIG. 11, it is possible to include plural kinds of memories in accordance with the kind of information to be stored and the function of the semiconductor device 601. The memory controlling circuit 622 controls the memory 621 when information stored in the memory 621 is read or information is written in the memory 621. Specifically, the memory controlling circuit 622 can generate a writing signal, a reading signal, a memory selecting signal, and the like; specify an address; or the like.

The structure controlling circuit 624 can generate a signal for controlling the microstructure 603. For example, in the case of controlling the microstructure 603 in accordance with an instruction from the reader/writer, a signal for controlling the microstructure 603 is generated based on the signal decoded by the decoding circuit 615. Further, in the case where data such as a program for controlling operation of the microstructure 603 is stored in the memory 621, a signal for controlling the microstructure 603 is generated based on the data read from the memory 621. Further, the structure controlling circuit 624 can also have a feedback function of generating a signal for controlling the microstructure 603 based on data in the memory 621, data from the reader/writer, and data obtained from the microstructure 603.

The arithmetic circuit 623 can process data obtained from the microstructure 603, for example. Moreover, the arithmetic circuit 623 can perform information processing or the like in the case where the structure controlling circuit 624 has the above-mentioned feedback function. The A/D converting circuit 625 is a circuit of converting analog data to digital data, and transmits a control signal to the microstructure 603, or converts data from the microstructure 603 and transmits the data to each circuit. The signal amplifying circuit 626 can amplify a weak signal obtained from the microstructure 603 and transmit to the A/D converting circuit 625.

The microstructure 603 is electrically connected to the electric circuit 604. Further, as a specific structure of the microstructure 603, the microstructure of the present invention can be applied. For example, the microstructure described in any of Embodiment Modes 1 to 4 can be applied. Since the surfaces which face each other of the movable portion are different in roughness in the microstructure of the present invention, a defect can be prevented from occurring in the microstructure in the manufacturing process or during operation after being manufactured. Moreover, by providing protrusions in the movable portion, the movable portion can be made strong so that durability can be improved.

Further, the microstructure of the present invention can also be used as a switch included in the demodulating circuit 613. By using the microstructure of the present invention as the switch in the demodulating circuit 613, the circuit structure can be reduced in size. It is needless to say that the microstructure described in any of the above embodiment modes can also be arbitrary used as a switch in the above-described other circuits.

Such a semiconductor device enables wireless communication. The microstructure included in the semiconductor device has less possibility to buckle during operation since a plurality of unevenness is provided in the surfaces which face each other of the movable portion. Consequently, the semiconductor device including this microstructure is excellent in reliability.

Embodiment Mode 9

Figure 16:
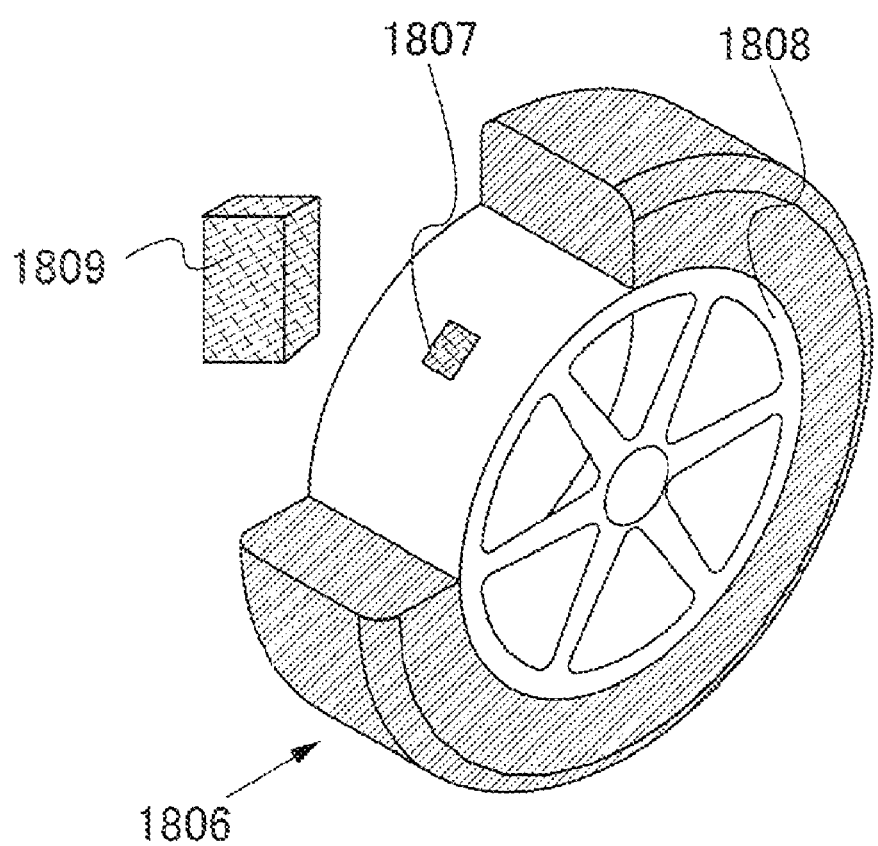
FIG. 16 is a diagram showing one example of a semiconductor device of the present invention.

This embodiment mode will describe a specific structure and another example of application of the semiconductor device described in any of the above embodiment modes, with reference to FIG. 16.

FIG. 16 illustrates a specific example of the case where the semiconductor device of the present invention is used as a pressure sensor. When the inflation pressure of a tire 1806 of a car is lowered, the amount of deformation of the tire 1806 is increased and the resistance is increased, which leads to deterioration in mileage performance and accidents. A semiconductor device of this embodiment mode can provide a system for monitoring the inflation pressure of the tire 1806 in a relatively easy way and regularly.

As shown in FIG. 16, a semiconductor device 1807 is disposed in a wheel portion 1808 of the tire 1806. Then, a reader/writer 1809 is put close to the semiconductor device 1807 to perform wireless communication, thereby obtaining information on the inflation pressure of the tire 1806. As the semiconductor device 1807, for example, the semiconductor device 601 including the microstructure 603 described in the above embodiment mode can be applied. The wireless communication technique or the like is similar to that of Embodiment Mode 8.

According to this embodiment mode, an inflation pressure of a tire can be monitored in a relatively easy way and regularly without going to a gas station or a car maintenance shop.

By providing the semiconductor deice 1807 in the tire 1806 as described above, the inflation pressure of the tire 1806 can be monitored regularly by wireless communication. The microstructure included in the semiconductor device has less possibility to buckle during operation (monitoring the inflation pressure) since a plurality of unevenness is provided in the surfaces which face each other of the movable portion. Consequently, the semiconductor device including this microstructure is excellent in reliability.

Note that this embodiment mode can be freely combined with any of the above embodiment modes.

Embodiment 1

Figure 15A:
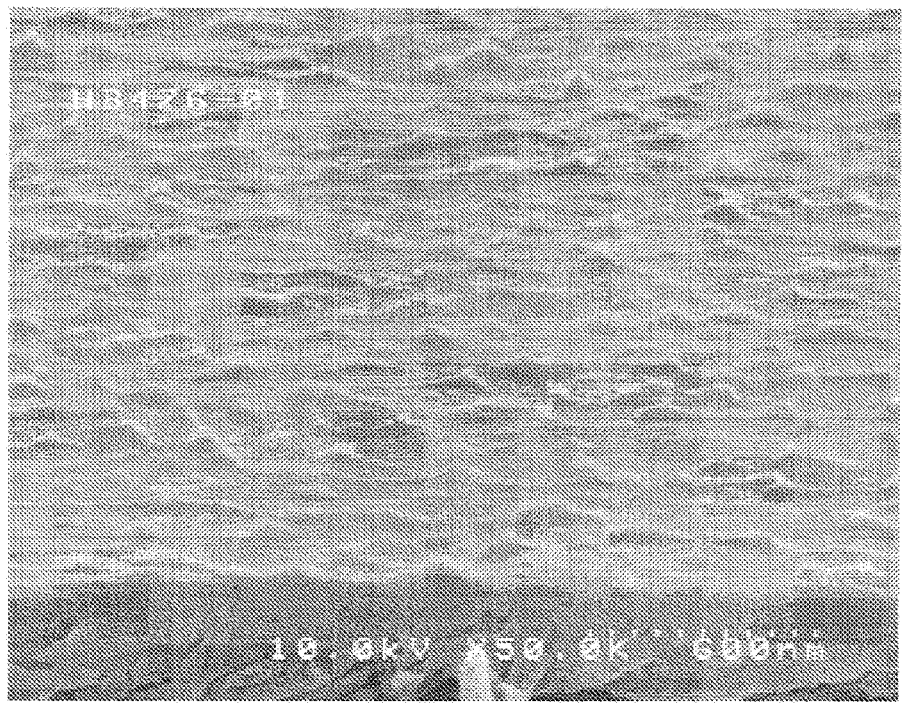
FIGS. 15A and 15B are SEM photographs of surfaces of a crystalline silicon film and a tungsten film.
Figure 15B:
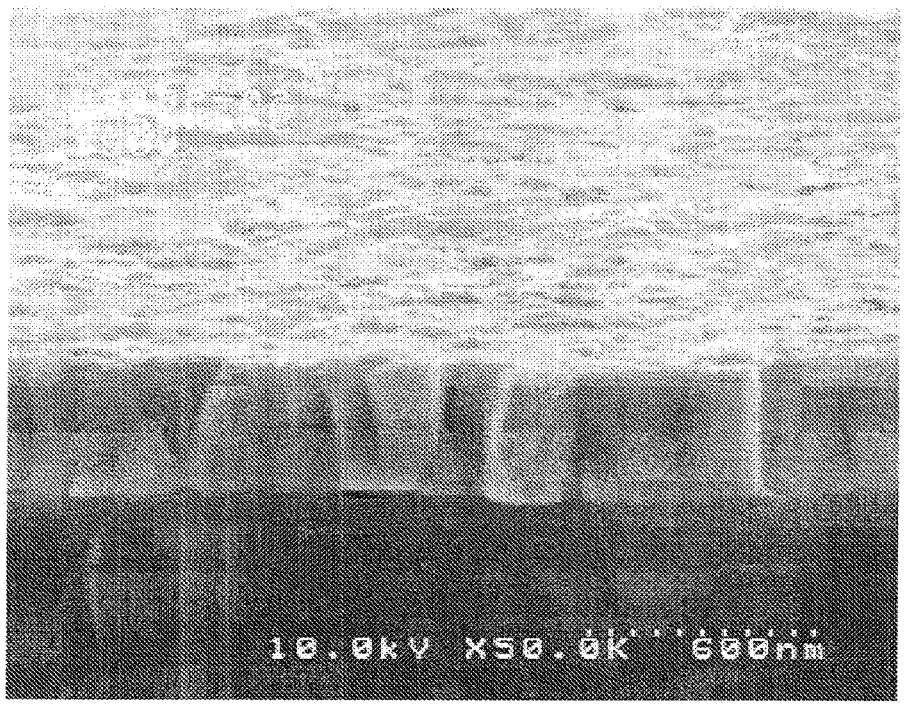

This embodiment will describe a crystalline silicon film which is to be a first structural layer and a tungsten film which is to be a second structural layer of a microstructure of the present invention. FIG. 15A is a SEM (scanning electron microscope) photograph of a surface of a crystalline silicon film. FIG. 15B is a SEM (scanning electron microscope) photograph of a surface of a tungsten film. Note that FIGS. 15A and 15B are the photographs when the magnifying power of the scanning electron microscope is set at 500000.

Next, a manufacturing method of the crystalline silicon film shown in FIG. 15A will be briefly described. First, an amorphous silicon film was formed at approximately 50 nm over a glass substrate. Next, nickel was added and heat treatment was performed to crystallize the amorphous silicon film. Next, an oxide film such as a natural oxide film formed on the crystallized silicon film was removed by using hydrofluoric acid. Then the silicon film was irradiated with a laser beam. The laser beam irradiation was performed with an excimer laser ($\lambda$=308 nm) at a scanning rate of 2.5 mm/sec, 60 Hz, and an energy density of 310 mJ/cm$^2$.

Next, a semiconductor film containing a rare gas element such as Ar was formed over the silicon film with an oxide film such as a natural oxide film interposed therebetween. Then by heat treatment, nickel gettering was performed to the semiconductor film containing a rare gas element. Then, the semiconductor film containing a rare gas element was etched away with an alkaline solution such as tetramethyl ammonium hydroxide (TMAH), and the oxide film was then removed by using a hydrofluoric acid based solution. FIG. 15A is a SEM photograph of the surface of the crystalline silicon film manufactured up to here.

From the photograph of FIG. 15A, it can be seen that a plurality of unevenness (ridges) are formed in the surface of the crystalline silicon film. Therefore, by irradiating an amorphous silicon film with a laser beam so that the amorphous film is crystallized, a crystalline silicon film on which a plurality of unevenness is formed, namely a first structural layer can be obtained.

Next, brief description will be made on FIG. 15B. First, a tungsten film was formed at a thickness of approximately 400 nm over a quartz substrate. Next, irradiation with a YAG laser ($\lambda$=1064 nm) was performed at an output of 150 W and a scanning rate of 0.5 mm/sec. FIG. 15B is a SEM photograph of the surface of the tungsten film at this time.

From the photograph of FIG. 15B, it can be seen that a plurality of unevenness is formed also in the surface of the tungsten film. In addition, it can be seen that the surface is rougher than the surface of the crystalline silicon film shown in FIG. 15A. Therefore, by irradiating a tungsten film with a laser beam, a tungsten film in which the surface is rougher than that of the crystalline silicon film, namely a sacrifice layer can be obtained. Then, a second structural layer is formed over the sacrifice layer, so that the second structural layer along the shape of the sacrifice layer can be obtained. Therefore, a surface of the second structural layer is rougher than that of the first structural layer.

(Addition)

As set forth above, the present invention contains the following modes.

A microstructure of the present invention includes a first structural layer and a movable second structural layer, in which at least one surface of the first structural layer has a plurality of protrusions A and at least one surface of the second structural layer has a plurality of protrusions B, a distance between vertexes of the adjacent protrusions A in the plurality of protrusions A is different from a distance between vertexes of the adjacent protrusions B in the plurality of protrusions B, and the one surface having the protrusions A of the first structural layer and the one surface having the protrusions B of the second structural layer face each other.

Another structure of the microstructure of the present invention includes a first structural layer, a movable second structural layer, and a space portion between the first structural layer and the second structural layer, in which at least one surface of the first structural layer has a plurality of protrusions A and at least one surface of the second structural layer has a plurality of protrusions B, a distance between vertexes of the adjacent protrusions A in the plurality of protrusions A is different from a distance between vertexes of the adjacent protrusions B in the plurality of protrusions B, and the one surface having the protrusions A of the first structural layer and the one surface having the protrusions B of the second structural layer face each other.

Another structure of the microstructure of the present invention includes a first structural layer and a movable second structural layer, in which at least one surface of the first structural layer has a plurality of protrusions A and at least one surface of the second structural layer has a plurality of protrusions B, the one surface having the protrusions A of the first structural layer and the one surface having the protrusions B of the second structural layer face each other, and a distance between vertexes of the adjacent protrusions A in the plurality of protrusions A is larger than a distance between vertexes of the adjacent protrusions B in the plurality of protrusions B.

Another structure of the microstructure of the present invention includes a first structural layer, a movable second structural layer, and a space portion between the first structural layer and the second structural layer, in which at least one surface of the first structural layer has a plurality of protrusions A and at least one surface of the second structural layer has a plurality of protrusions B, the one surface having the protrusions A of the first structural layer and the one surface having the protrusions B of the second structural layer face each other, and a distance between vertexes of the adjacent protrusions A in the plurality of protrusions A is larger than a distance between vertexes of the adjacent protrusions B in the plurality of protrusions B.

Further, in another structure of the microstructure of the present invention, the distance between vertexes of the protrusions A is 1.5 to 10 times inclusive as large as the distance between vertexes of the protrusions B.

Further, in another structure of the microstructure of the present invention, the distance between vertexes of the protrusions A is in the range of 0.2 μm to 1 μm inclusive.

Further, in another structure of the microstructure of the present invention, the distance between vertexes of the protrusions B is in the range of 0.02 μm to 0.1 μm inclusive.

Further, in another structure of the microstructure of the present invention, the first structural layer is a crystalline silicon layer.

A manufacturing method of a microstructure of the present invention includes forming a first structural layer over an insulating surface, performing surface roughening to the first structural layer, forming a sacrifice layer over the first structural layer, performing surface roughening to the sacrifice layer, forming a second structural layer over the sacrifice layer, and removing the sacrifice layer.

Another manufacturing method of the microstructure of the present invention includes forming a first structural layer over an insulating surface, performing surface roughening to the first structural layer to form a plurality of protrusions A in a surface of the first structural layer, forming a sacrifice layer over the first structural layer, performing surface roughening to the sacrifice layer to form a plurality of protrusions C in a surface of the sacrifice layer, forming a second structural layer over the sacrifice layer, and removing the sacrifice layer.

Further, in another manufacturing method of the microstructure of the present invention, the formation is performed such that a distance between vertexes of the protrusions A is 1.5 to 10 times inclusive as large as a distance between vertexes of the protrusions C.

Further, in another manufacturing method of the microstructure of the present invention, the formation is performed such that the distance between vertexes of the protrusions A is in the range of 0.2 μm to 1 μm inclusive.

Further, in another manufacturing method of the microstructure of the present invention, the formation is performed such that the distance between vertexes of the protrusions C is in the range of 0.02 μm to 0.1 μm inclusive.

Further, in another manufacturing method of the microstructure of the present invention, laser irradiation is performed as the surface roughening of the first structural layer.

Further, in another manufacturing method of the microstructure of the present invention, tungsten, molybdenum, or titanium is used for the sacrifice layer, and laser irradiation is performed as the surface roughening of the sacrifice layer.

Further, in another manufacturing method of the microstructure of the present invention, aluminum is used for the sacrifice layer, and heat treatment is performed as the surface roughening of the sacrifice layer.

This application is based on Japanese Patent Application Serial No. 2006-066786 filed in Japan Patent Office on Mar. 10, 2006, the entire contents of which are hereby incorporated by reference.

What is claimed is:

1. A microstructure comprising:
    a first structural layer having a first surface with a first roughness; and
    a second structural layer having a first portion fixed to a first part of the first surface, and a second portion having a second surface with a second roughness facing a second part of the first surface with a space interposed between the second part of the first surface and the second surface,
    wherein at least one of the first structural layer and the second structural layer is displaceable, and
    wherein the first roughness and the second roughness are different from each other.

2. The micro structure according to claim 1, wherein one of the first structural layer and the second structural layer is a crystalline silicon film.

3. A microstructure according to claim 1, wherein a first distance between vertexes of the most adjacent protrusions of the first structural layer is longer than a second distance between vertexes of the most adjacent protrusions of the second structural layer.

4. A microstructure according to claim 3, wherein the first distance is in the range of 0.2 μm to 1 μm and the second distance is in the range of 0.02 μm to 0.1 μm.

5. A microstructure according to claim 1, wherein the second structural layer comprises one selected from the group consisting of silicon oxide and silicon nitride.

6. A semiconductor device comprising a microstructure and a semiconductor element provided over a substrate,
    wherein the microstructure comprises a first structural layer and a second structural layer which faces the first structural layer with a space portion interposed therebetween and is partially fixed to the first structural layer;
    wherein the semiconductor element comprises a semiconductor layer and a gate electrode layer which is provided over the semiconductor layer with a gate insulating layer interposed therebetween;
    wherein the first structural layer is formed of a material which is the same as the semiconductor layer;
    wherein a part of the second structural layer is formed of a material which is the same as the gate insulating layer; and
    wherein at least one of the first structural layer and the second structural layer of the microstructure is displaceable, and opposed surfaces of the first structural layer and the second structural layer are different in roughness.

7. The semiconductor device according to claim 6, wherein each of the first structural layer of the microstructure and the semiconductor layer of the semiconductor element is a crystalline silicon film.

8. The microstructure according to claim 6, wherein a first distance between vertexes of the most adjacent protrusions of the first structural layer is longer than a second distance between vertexes of the most adjacent protrusions of the second structural layer.

9. A microstructure according to claim 6, wherein the first distance is in the range of 0.2 μm to 1 μm and the second distance is in the range of 0.02 μm to 0.1 μm.

10. A microstructure according to claim 6, wherein the second structural layer comprises one selected from the group consisting of silicon oxide and silicon nitride.

* * * * *